(12) United States Patent
Ling et al.

(10) Patent No.: US 8,061,583 B2
(45) Date of Patent: Nov. 22, 2011

(54) BALL MOUNTING APPARATUS AND METHOD

(75) Inventors: Nee Seng Ling, Singapore (SG); Soo Loo Ang, Singapore (SG); Ter Siang Pai, Singapore (SG)

(73) Assignee: Rokko Ventures Pte Ltd, Singapore (SG)

( * ) Notice: Subject to any disclaimer, the term of this patent is extended or adjusted under 35 U.S.C. 154(b) by 222 days.

(21) Appl. No.: 12/515,900

(22) PCT Filed: Nov. 22, 2007

(86) PCT No.: PCT/SG2007/000402
§ 371 (c)(1),
(2), (4) Date: May 21, 2009

(87) PCT Pub. No.: WO2008/063138
PCT Pub. Date: May 29, 2008

(65) Prior Publication Data
US 2010/0051671 A1    Mar. 4, 2010

(30) Foreign Application Priority Data

Nov. 22, 2006 (SG) ................................. 200608015
May 7, 2007 (SG) ................................. 200703231

(51) Int. Cl.
*B23K 1/00* (2006.01)
(52) U.S. Cl. .................... 228/180.22; 228/6.1
(58) Field of Classification Search ..... 228/178–180.22, 228/214, 223
See application file for complete search history.

(56) References Cited

U.S. PATENT DOCUMENTS

| 5,695,667 A * | 12/1997 | Eguchi et al. ................ 219/388 |
| 2003/0047527 A1 | 3/2003 | Master et al. |
| 2003/0127501 A1 | 7/2003 | Cheng et al. |
| 2006/0065972 A1 | 3/2006 | Kahn et al. |

FOREIGN PATENT DOCUMENTS

| JP | 2000077837 A * | 3/2000 |
| JP | 2007-005653 A | 1/2007 |

OTHER PUBLICATIONS

Machine translation of JP 2000-077837 Ukai.*
International Search Report, mailed Feb. 10, 2010, of corresponding international Application No. PCT/SG2007/000402.
International Preliminary Report on Patentability, dated Mar. 2, 2010, of corresponding international Application No. PCT/SG2007/000402.
Written Opinion, mailed Feb. 10, 2010, of corresponding international Application No. PCT/SG2007/000402.

* cited by examiner

*Primary Examiner* — David Sample
*Assistant Examiner* — Megha Mehta
(74) *Attorney, Agent, or Firm* — Alston and Bird LLP

(57) ABSTRACT

A device for mounting an array of solder balls to a plurality of substrates of integrated circuits, comprising: a first plate for receiving a first substrate in a loading position; said first plate adapted to translate laterally from a substrate loading position to a flux receiving position; said first plate further adapted to rotate 180° from the substrate loading position to a such that the first plate is in a solder ball receiving position, and; mounting solder balls to the first plate.

9 Claims, 17 Drawing Sheets

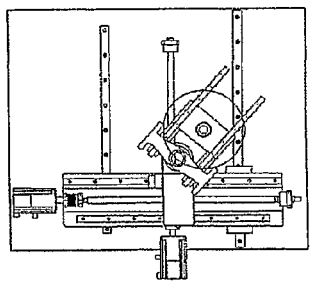
FIGURE 9D
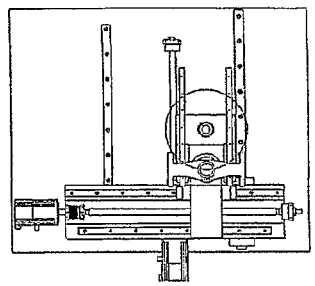
FIGURE 9C
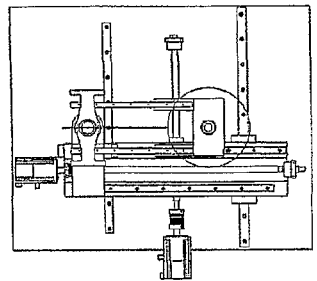
FIGURE 9G
FIGURE 9A-G
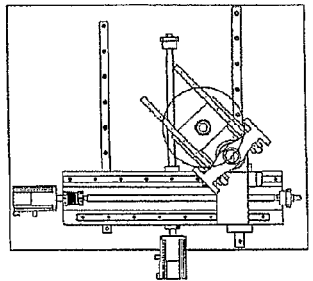
FIGURE 9B
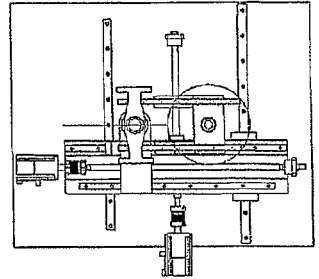
FIGURE 9F
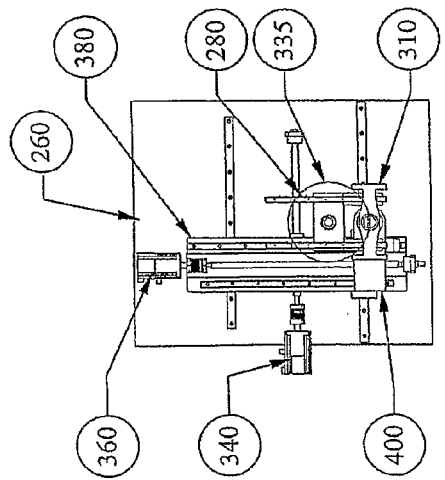
FIGURE 9A
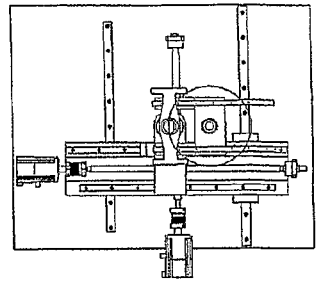
FIGURE 9E

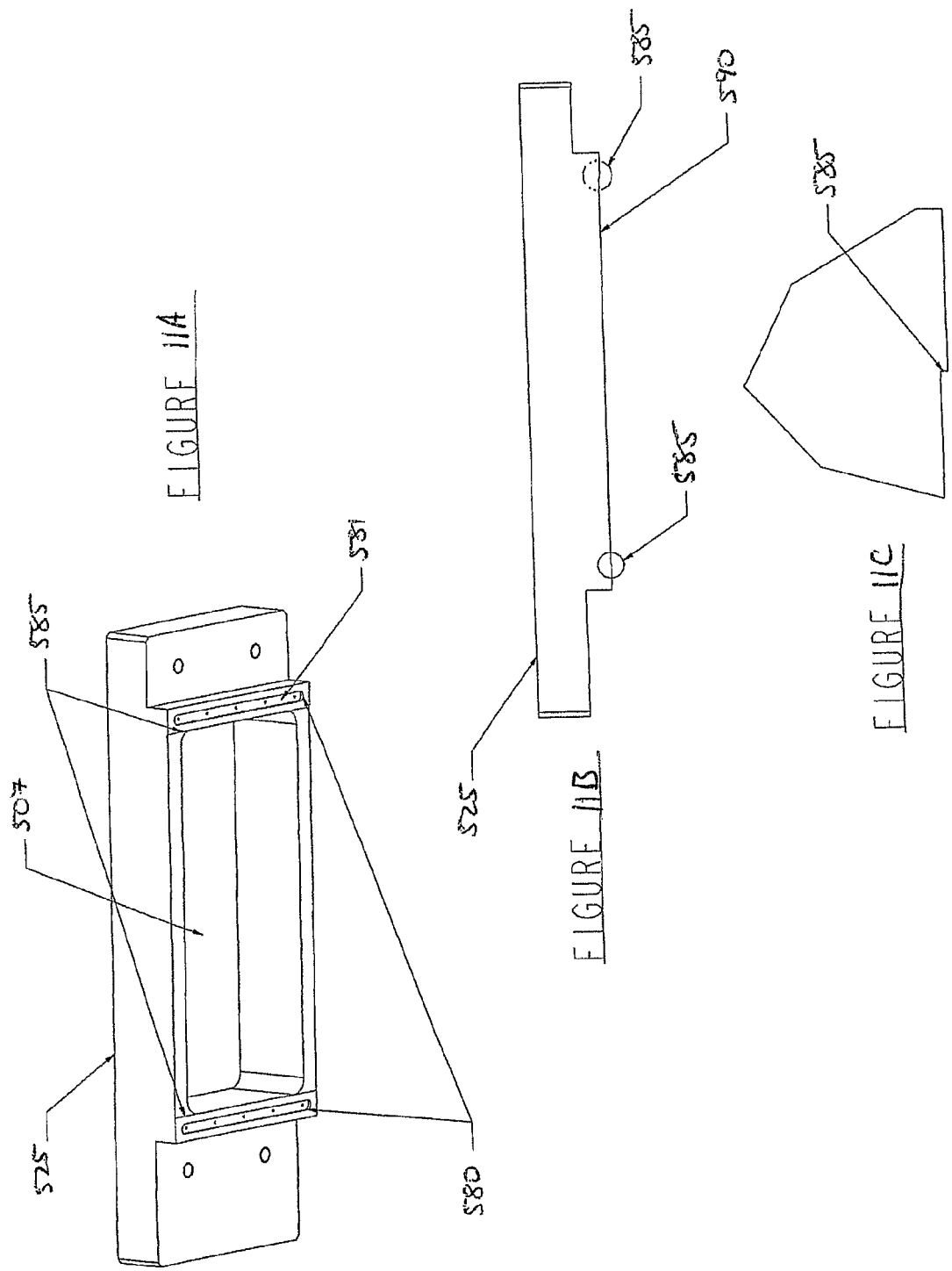

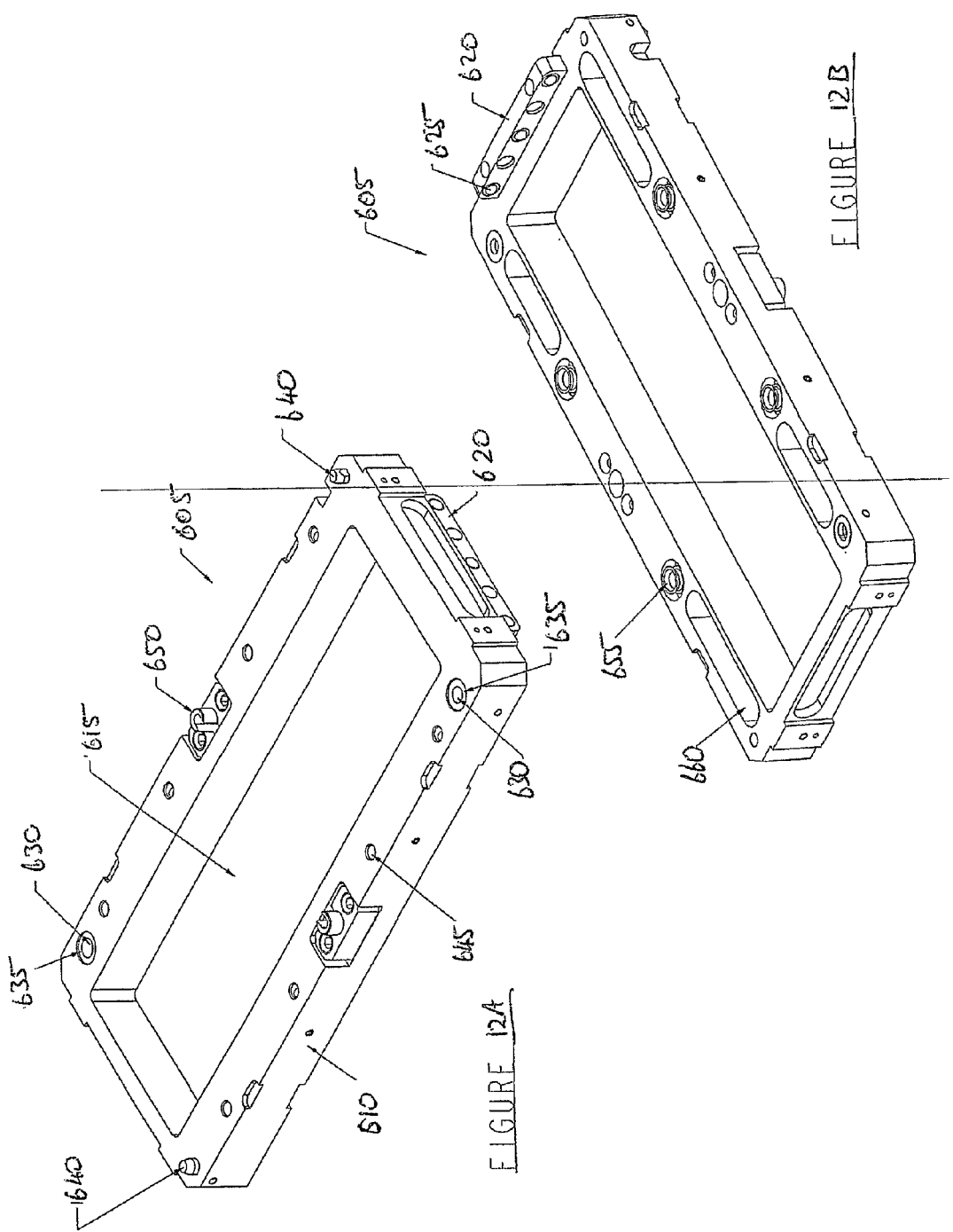

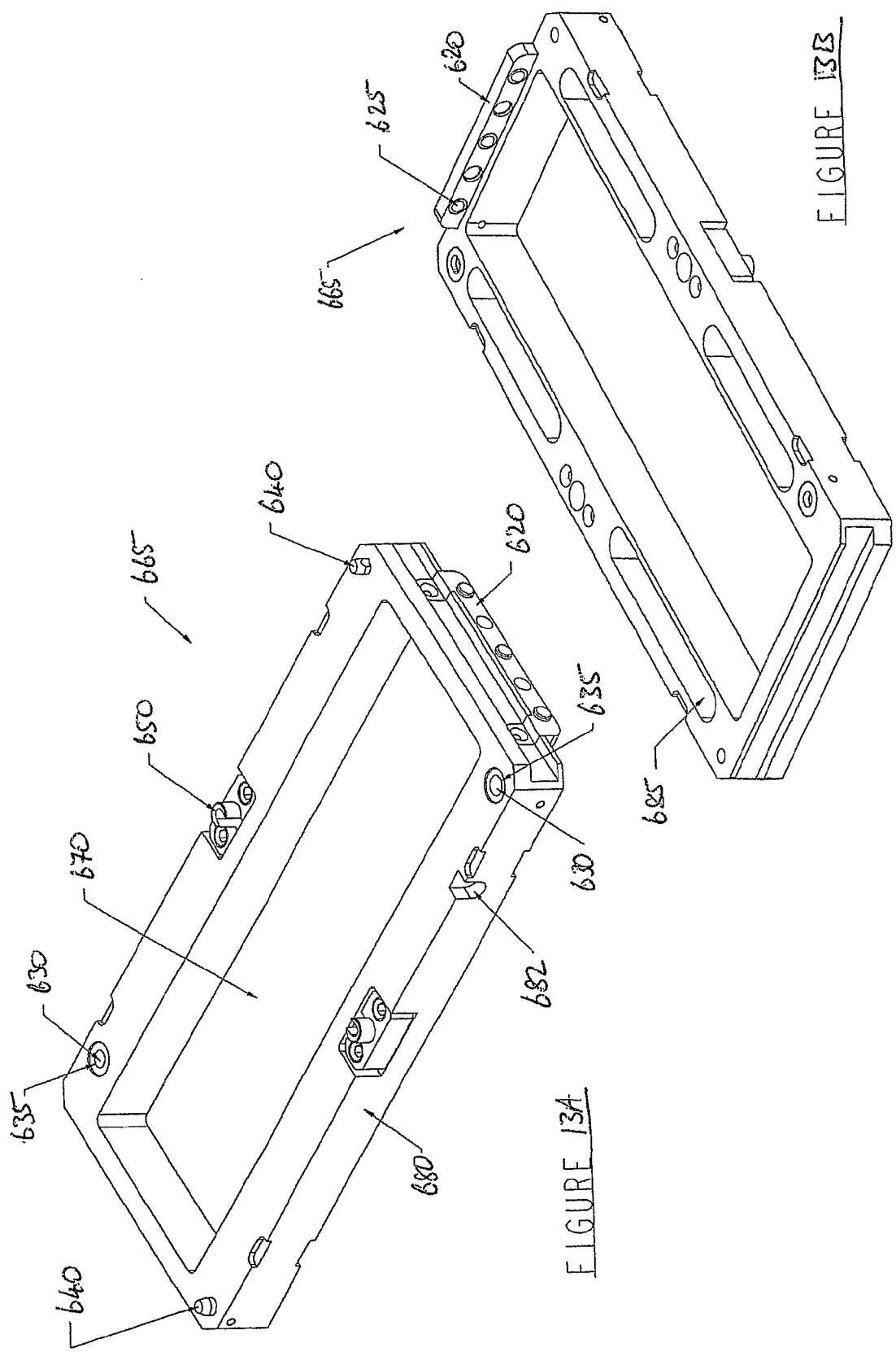

BALL MOUNTING APPARATUS AND METHOD

CROSS REFERENCE TO RELATED APPLICATIONS

This application is a 35 U.S.C. 371 national phase application of International Application No. PCT/SG2007/000402, filed Nov. 22, 2007, which International Application was published by the International Bureau in English on May 29, 2008, and which claims priority from SG 200608015-4, filed Nov. 22, 2006 and SG 200703231-1, filed May 7, 2007, all of which are incorporated herein by reference in their entirety.

FIELD OF THE INVENTION

The invention relates to ball grid arrays and more particularly the placement of solder balls in such arrays placed upon substrates prior to dicing.

BACKGROUND

Ball grid arrays are arrays for receiving solder balls which are used as electrodes for connection to integrated circuits. They are placed whilst the integrated circuit is still within a substrate prior to or after dicing of said substrate.

The substrate, in general terms, is passed into a flux deposition platform and then to a ball mounting platform where upon the balls are mounted within the flux in precisely located arrangements.

Solder Ball Placement Machines are employed to attach the solder balls within the area-array package substrates where they form the final interconnection to the substrate. The Solder Ball Placement Machine performs two main processes, which are flux deposit on the substrate, followed by solder balls placement on the substrate. Flux is used to remove oxidation on the solder pad for better connectivity and bonding, and to hold the solder ball in place before the substrate is sent to the reflow oven to melt the solder ball to complete the bonding.

In one method, the flux and solder balls processing regions are located in series whereby the substrate is passed within the flux processing region so that flux is applied to the array. Subsequently the substrate is passed to the ball mounting platform whereby a ball robot places the solder balls in a precise benchmark. The substrate is subsequently passed out of the ball mounting apparatus and subsequently sent for dicing.

For this arrangement, fiducial vision of the substrate on each platform is taken so as to locate the position and orientation of the substrate and so precisely place both the flux and solder balls.

A flaw in this method, however, is the need to take two separate set of fiducial vision of the substrate on the two separate platforms. This will worsen the bottle neck at the ball mounting station as the ball pick head being the apparatus for placing the balls must first determined whether the head is fully laden with balls such that there are none missing from the cavity used for placing the balls and subsequently checked that all balls were deposited from the head and no particular cavity still having a ball jammed within the head and so not transferred to the array. This double inspection system controls the flow of substrates through the ball mounting device and can consequently miss the overall speed of this process.

In a different arrangement, the flux and ball mounting regions are placed parallel to each other such that the substrate is passed into the device and the flux positioning head and ball pick head positioned to access the substrate without having to move the substrate from one station to the next. In this way, the fiducial vision of the substrate to ensure orientation and position of the substrate is correct, need only be taken once and not separately at the flux region and ball region, so consequently for this reason will be a faster process compared to the previous. However, the limitation of this arrangement is that the single platform can only be worked on by the Flux or the Ball Head at one time and either one will be idle, so the benefit of a single fiducial vision check is wasted as the bottle neck is now at the single mounting platform and it causes an increase in the machine cycle time.

In another facet of the process, the flux pool generally comprises a pair of sweeping flux applicators mounted on a linear slide and arranged to travel backward and forward over a supply of flux deposited on a plate. The flux applicator, during the sweeping motion forms a layer of flux at a predetermined thickness as controlled by the height of the flux applicator. The sweeping action is driven by a speed control motor and often including a pair of pneumatic actuators.

During sweeping, one flux applicator will be in a lowered position at the fixed height from the flux pool to form the predetermined flux thickness. The thickness of flux on the plate will control the amount of flux taken by a flux tool which then applies the controlled amount of flux to a substrate. As a means of ensuring the flux pool has a sufficient supply, there is a sensor which measures the level of flux in the flux pool that on reaching a lower limit, which activates a flux refiner to add new flux to the flux pool.

The flux refiner typically comprises a syringe subjected to an external air supply so as to apply pressure to the plunger of the syringe and consequently inject the flux into the flux pool.

Whilst there are variations known in the industry many typically have similar arrangements including the use of a syringe in order to inject flux into the flux pool. Accordingly, these suffer the problem of syringes generally in that not all the contents of the syringe can be completely removed. Instead a "slug" or "tailing" of the flux remains in the exit chamber preceding the nozzle of the syringe. This remaining flux may be partially exposed to the external environment and therefore, can become contaminated on the next usage of the syringe. Further, whilst the flux is viscous, it can still drip from the nozzle and so the tailing remaining in the nozzle may drip and so place flux on the peripheral elements of the flux pool. Accordingly the flux that contacts areas outside the flux pool may further become contaminated and if then inadvertently added to the flux pool can cause contamination to the entire flux pool.

This may also result in contamination that may spread to subsequent substrates, contaminating an entire batch of substrates to which the solder balls are being attached.

In a further facet, once the flux is applied to the substrate, solder balls are then mounted to the flux for further processing. The arrangement of the solder balls on to the substrate requires a very precise arrangement to a very high tolerance.

Templates are used as a means of establishing a predetermined array for the batch process of placing small scale units such as solder balls for down stream manufacturing purposes.

The time consuming activity of placing the solder balls within the highly defined arrays is one that can be alleviated by automating their placement of the units within said arrays. One such method involves pouring the solder balls into the templates for a gravity placement of the arrays. It follows that this method would be extremely inaccurate. Another such method involves sweeping a reservoir of solder balls across the template so as to maintain a more precise correspondence with the array through maintaining a pre-determined gap between the reservoir and the array. The maintenance of this very precise gap has led to a high quality in output and less wastage through misplacement of solder balls within the array.

The difficulty with this approach is the level of tolerance required to maintain the gap. It is necessary to establish a datum from which to measure the gap and for the mechanical system required for distribution of the solder balls to the array. Fixed points relative to the reservoir such as a base plate underlying the template or a linear slide to which the reservoir is mounted so as to distribute the balls are logical places to establish the datum. The precision requires a high degree of machining which adds to the manufacturing costs of the device. Further poor linearity of the linear slide or warpage of the base plate must be avoided to maintain the precision required.

Without maintaining a high precision for the gap, it is very difficult to accurately distribute the solder balls particularly as a template may require an array having a planar area of 300 mm×90 mm. The degree of flatness required over such an area represents a significant manufacturing cost for the equipment.

Further, even if the machining is maintained to a very high tolerance, the installation of various components including the template will also require a high degree of quality. If the template is not precisely fitted to the device, then even a manufacture of high tolerance will not overcome the shortcomings of a poor installation.

SUMMARY OF INVENTION

Therefore, in a first aspect, the invention provides a method of mounting an array of solder balls to a plurality of substrates of integrated circuits, comprising the steps of: delivering a first substrate to a first plate in a loading position; laterally translating the first plate to a flux receiving position; applying flux to said first substrate; returning said plate to the loading position; rotating the first plate 180° such that the first plate is in a solder ball receiving position, and; mounting solder balls to the first plate.

In a second aspect, the invention provides a device for mounting an array of solder balls to a plurality of substrates of integrated circuits, comprising: a first plate for receiving a first substrate in a loading position; said first plate adapted to translate laterally from a substrate loading position to a flux receiving position; said first plate further adapted to rotate 180° from the substrate loading position to a such that the first plate is in a solder ball receiving position, and; mounting solder balls to the first plate.

In a third aspect, the invention provides a rotary conveyor assembly comprising a first and second actuator, the first actuator arranged to move the second actuator in a reciprocating motion; a rotary link adapted to rotate about a rotational fixture and rotationally mounted to the second actuator at a first end, such that the second actuator is arranged to move the first end in a reciprocating motion; said rotary link having a conveyor mounting mounted adjacent to the first end.

In a fourth aspect the invention provides a template assembly comprising; a template for receiving solder balls; a reservoir housing for containing a plurality of solder balls, said reservoir housing arranged to move over said template and distribute the solder balls within said template and; a fluid interface device for providing a fluid interface between the template and reservoir housing.

In a fifth aspect the invention provides a delivery device for delivery flux to a flux pool comprising; a flux containment chamber; a first pressure source for applying pressure to the contained flux within the containment chamber; an exit chamber and a nozzle, such that under pressure flux moves from the containment chamber through the exit chamber and exits the nozzle; wherein the exit chamber comprises a second pressure source for applying pressure to flux within the exit chamber.

In a sixth aspect, the invention provides an adaptor plate assembly for mounting a pick up head to a solder ball placement machine, the adaptor plate comprising; a plate having a central orifice; a resilient engagement portion having a plurality of resilient depressible projections located on a peripheral edge of said plate for resiliently engaging corresponding recesses in the solder ball placement machines; a plurality of location holes on a first face of said plate arranged to correspond with projections from the pick up head, and engagement portions for releaseably engaging the pick up head.

BRIEF DESCRIPTION OF DRAWINGS

It will be convenient to further describe the present invention with respect to the accompanying drawings that illustrate possible arrangements of the invention. Other arrangements of the invention are possible, and consequently the particularity of the accompanying drawings is not to be understood as superseding the generality of the preceding description of the invention.

FIGS. 9A to 9G are sequential plan views of movement of the rotary conveyor of FIG. 8;

FIGS. 11A to 11C are various views of the solder ball reservoir according to a further embodiment of the present invention;

FIGS. 12A and 12B are isometric views of an adaptor plate according to a further embodiment of the present invention;

FIGS. 13A and 13B are isometric views of an adaptor plate according to a further embodiment of the present invention;

DESCRIPTION OF PREFERRED EMBODIMENT

Figure 1A:
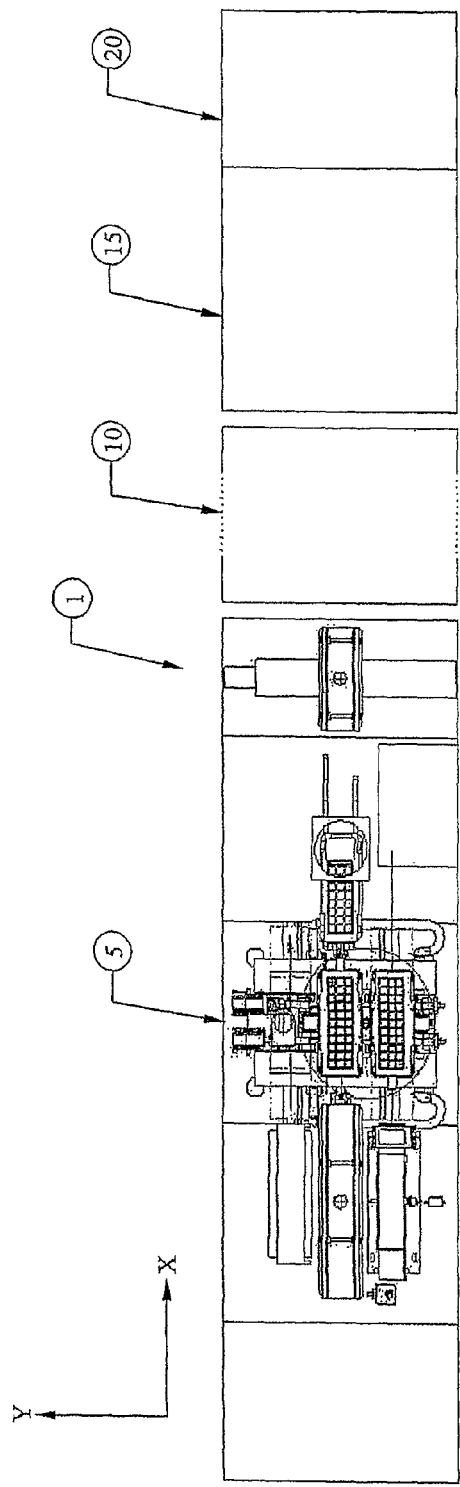
FIG. 1A is a plan view of a substrate processing device according to one embodiment of the present invention.

FIG. 1 shows an overview of a substrate processing device 1 comprising a ball mounting device 5, a re-flow & washer machine 10 immediately downstream from the ball mounting device 5, a collector 15 and a magazine unloader 20. The substrate processing device is used to process substrates, and specifically those that comprise integrated circuits (IC) with ball grid arrays (BGA) whereby solder balls are mounted to the IC's to form said arrays.

Figure 1B:
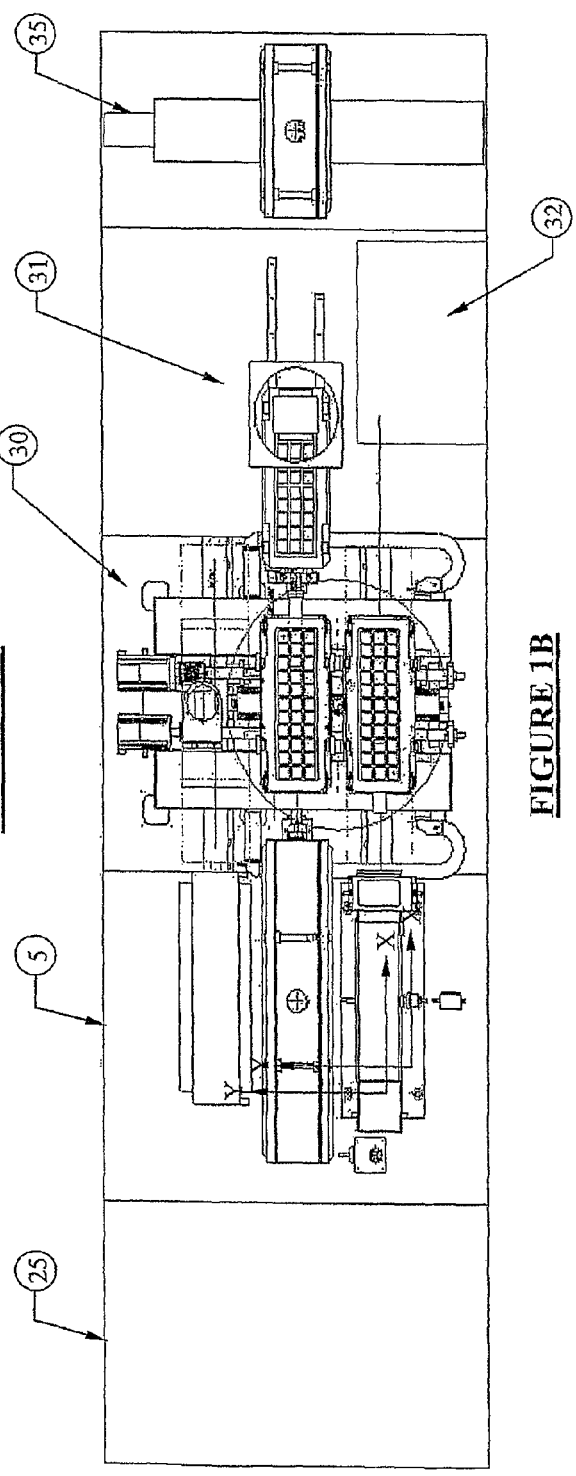
FIG. 1B is a plan view of a ball mounting device according to one embodiment of the present invention.
Figure 2:
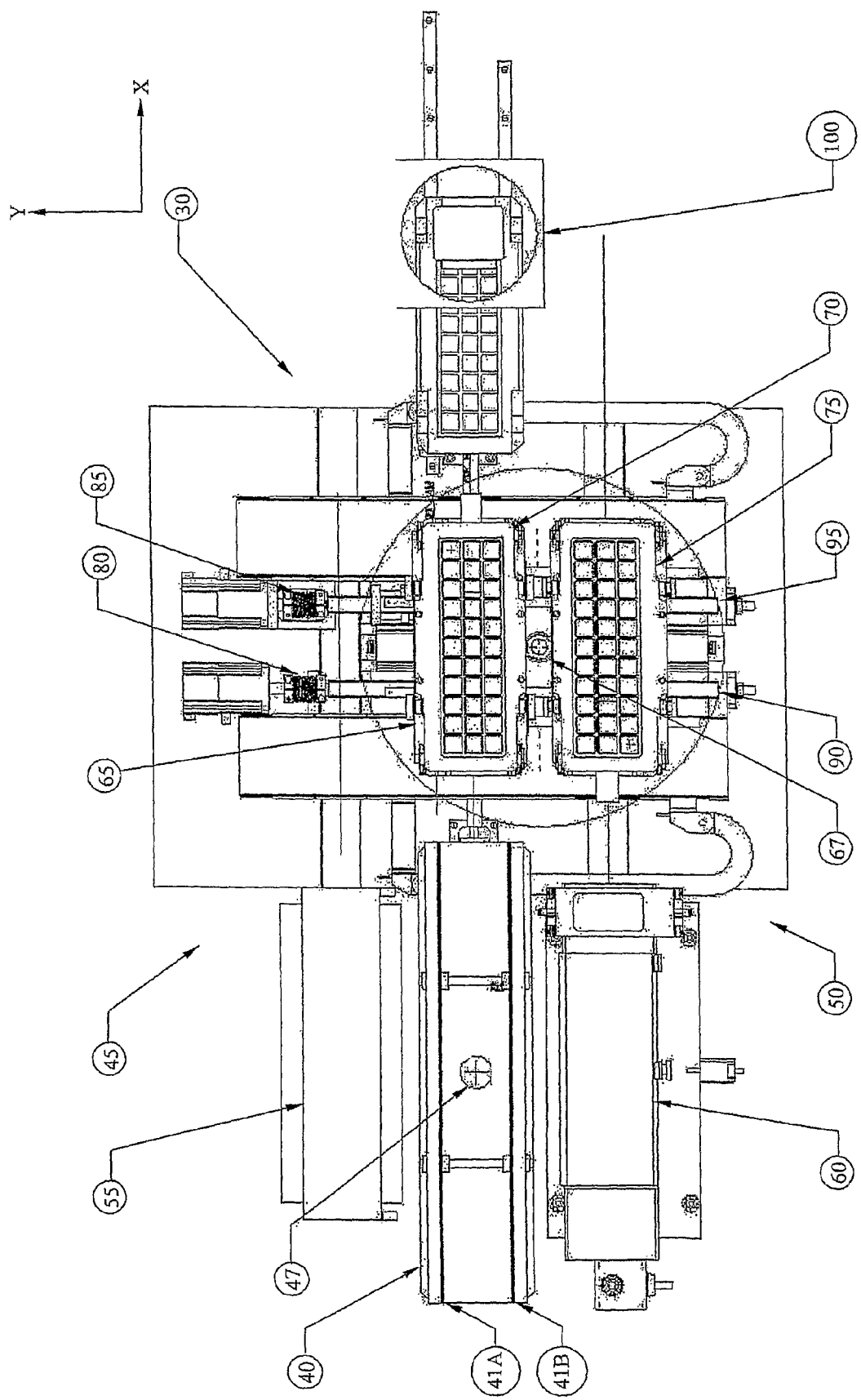
FIG. 2 is a detail view of the ball mounting device of FIG. 1B.
Figure 3:
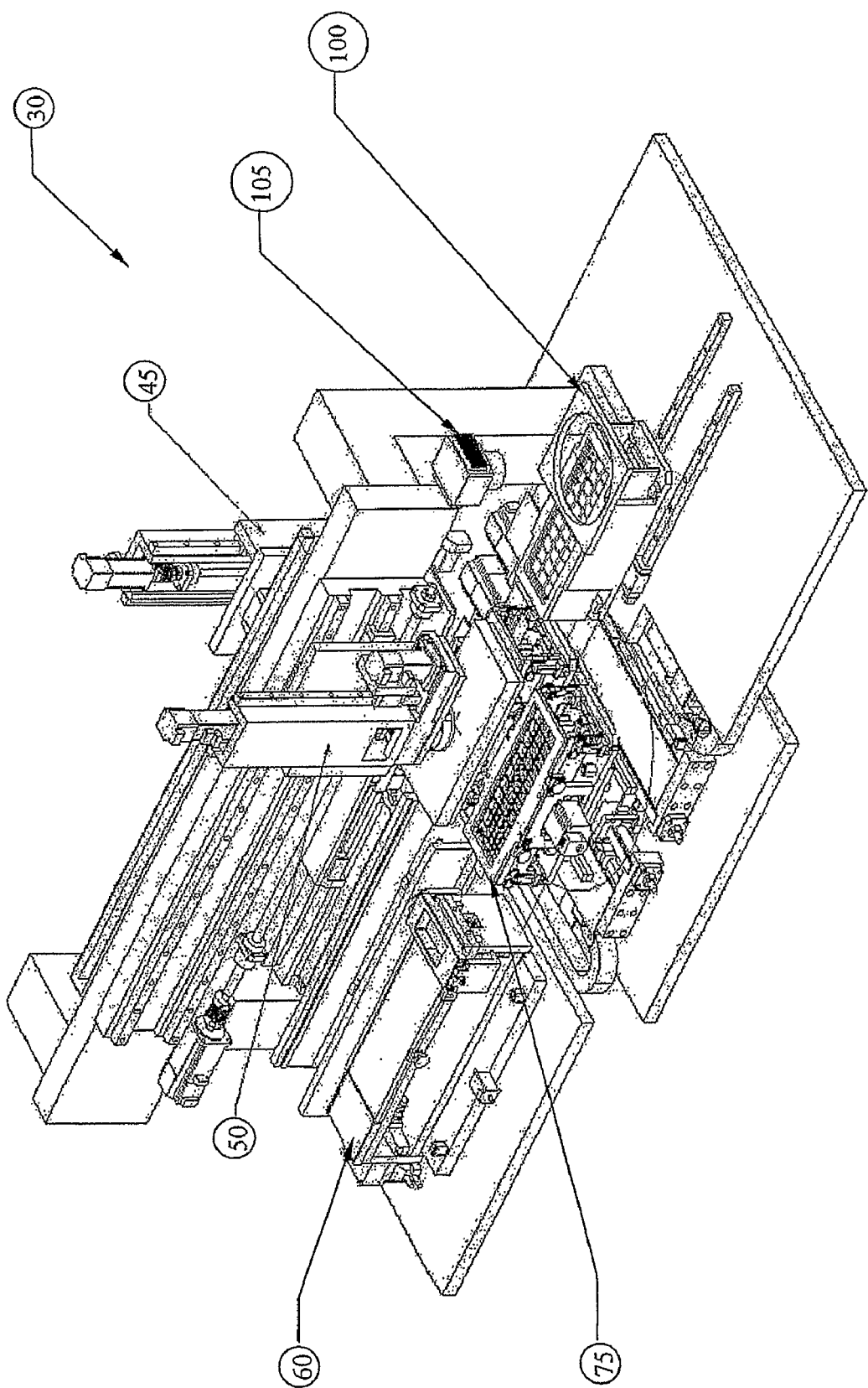
FIG. 3 is an isometric view of the ball mounting device of FIG. 2.

The invention relates to the ball mounting device 5, one embodiment of which is shown in FIGS. 1B, 2 and 3. At the upstream end of the ball mounting device 5 is the magazine loader 25. Typically, the loader 25 comprises an upper stage, lower stage, magazine clamp and pusher, which for clarity of the overall process are not shown. The upper stage is where magazines or cassettes loaded with substrates are inserted, prior to the mounting of the solder balls. A rubber belt, driven by rollers and an induction motor moves the loaded magazine towards the magazine clamp. The magazine clamp picks up the magazine and indexes the first substrates to the input conveyor 40.

Individual substrates are pushed one at a time into the input conveyor 40 when the magazine clamp index each substrates to the conveyor. Once all the substrates have been pushed out, the magazine clamp will place the empty magazine on the lower stage where the empty magazines are removed by the operator.

Input conveyor 40 comprises a pair of guide rails 41A, B, driving belts driven by an induction motor, inlet rollers, cleaning brush & vacuum module, orientation check sensor and substrate pusher, all of which combine to move the substrates through to the flux and ball mounting region.

The width of the guide rails 41A, B is adjustable by a stepper motor with feedback so as to conform to the width of the substrate that is keyed into the product recipe during initial setup. The inlet roller feeds each substrate into the rails 41A, B from the magazine with the driving belts on the rails carrying the substrate forward until it reaches a stopper. A sensor detects the presence of a substrate at the stopper whereby an orientation sensor will check for the correct orientation of the substrate at this position.

The stopper is driven by an air cylinder in an up/down motion to selectively permit or prevent movement of the substrate. There is also a cleaning brush & vacuum module along the input conveyor 40 to clean the substrate.

When the substrate is ready to be sent downstream, the input conveyor 40 moves towards the flux/ball mounting region 30, to close the gap between itself and the R-Y Twin Conveyor 65, located in the region 30. The initial gap is necessary to avoid interference with the rotation of the R-Y Twin Conveyor 65 once loading has taken place.

The process continues with the stopper retracting and the substrate pushed by the substrate pusher into one of the R-Y Twin conveyor 65 nearer to the flux robot 45 until the substrate reaches the stopper in the R-Y Twin conveyor 65. The substrate pusher horizontal X motion is driven by a stepper motor with feedback and the up/down motion is driven by an air cylinder.

The fiducial vision comprises two sets of cameras, optics and lightings mounted on two individual X-Y slides. It registers the actual substrate location in the twin conveyor 65 when the substrate is loaded as there is still some free play between the locating holes of substrate and the location pins. The machine system automatically provides an offset to the initial placement location base on the current substrate location. This provides a more consistent placement of flux and solders balls on the substrate.

In this embodiment, the R-Y Robot and Twin Conveyor 65 comprises two linear slides 80, 85, a rotatable twin conveyor 70, 75, rotation linkage mechanism 67, substrate pusher, substrate lifter and top plate. The twin conveyors 70, 75 are mounted separately on the two linear slides 80, 85 driven by two servo motors which the two conveyors 70, 75 are able to move in Y direction independent of each other and the twin conveyors 70, 75 can rotate together by the use of rotation linkages mechanism driven by servo motor.

Figure 6:
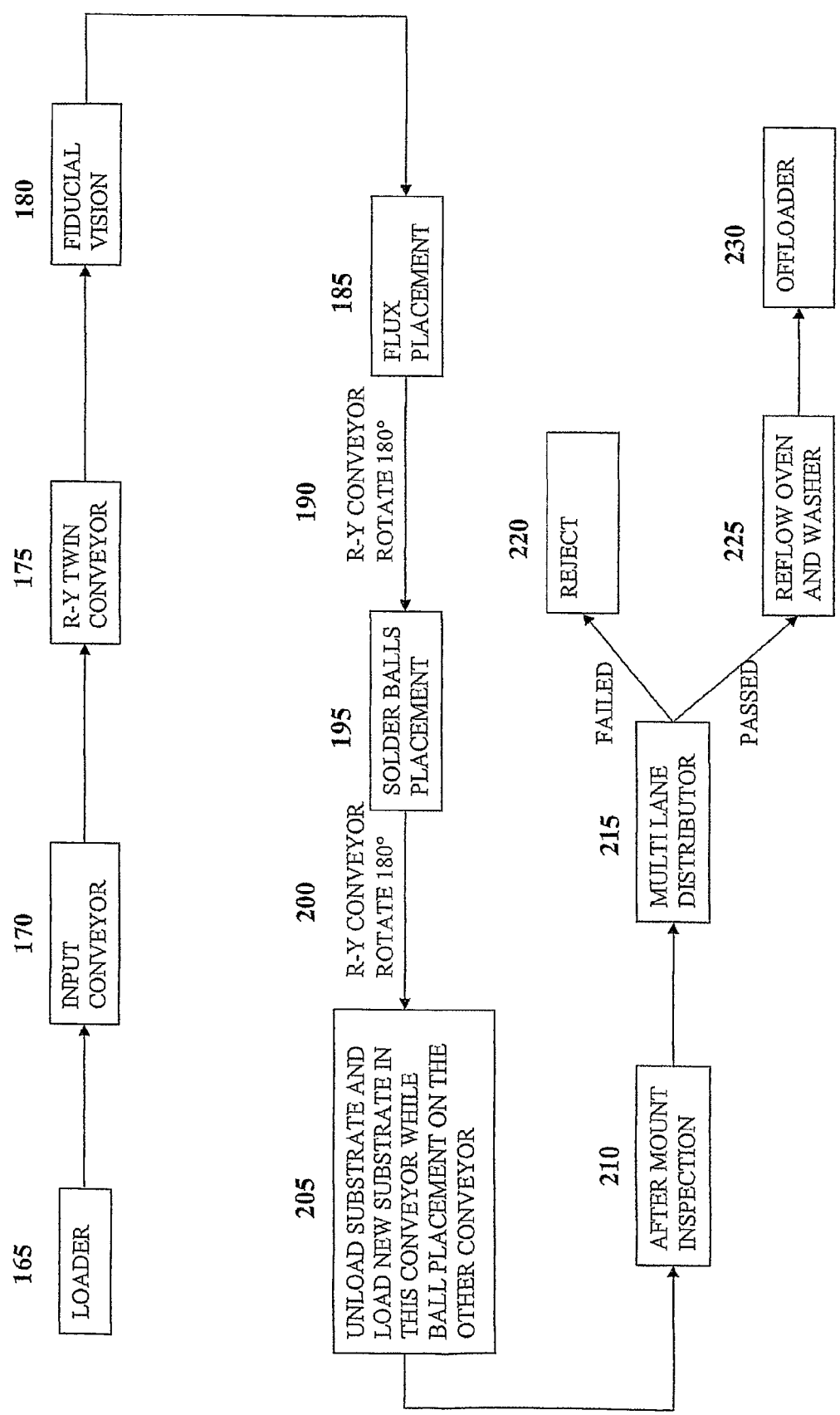
FIG. 6 is a flow chart of a ball mounting process according to one embodiment of the present invention.
Figure 7:
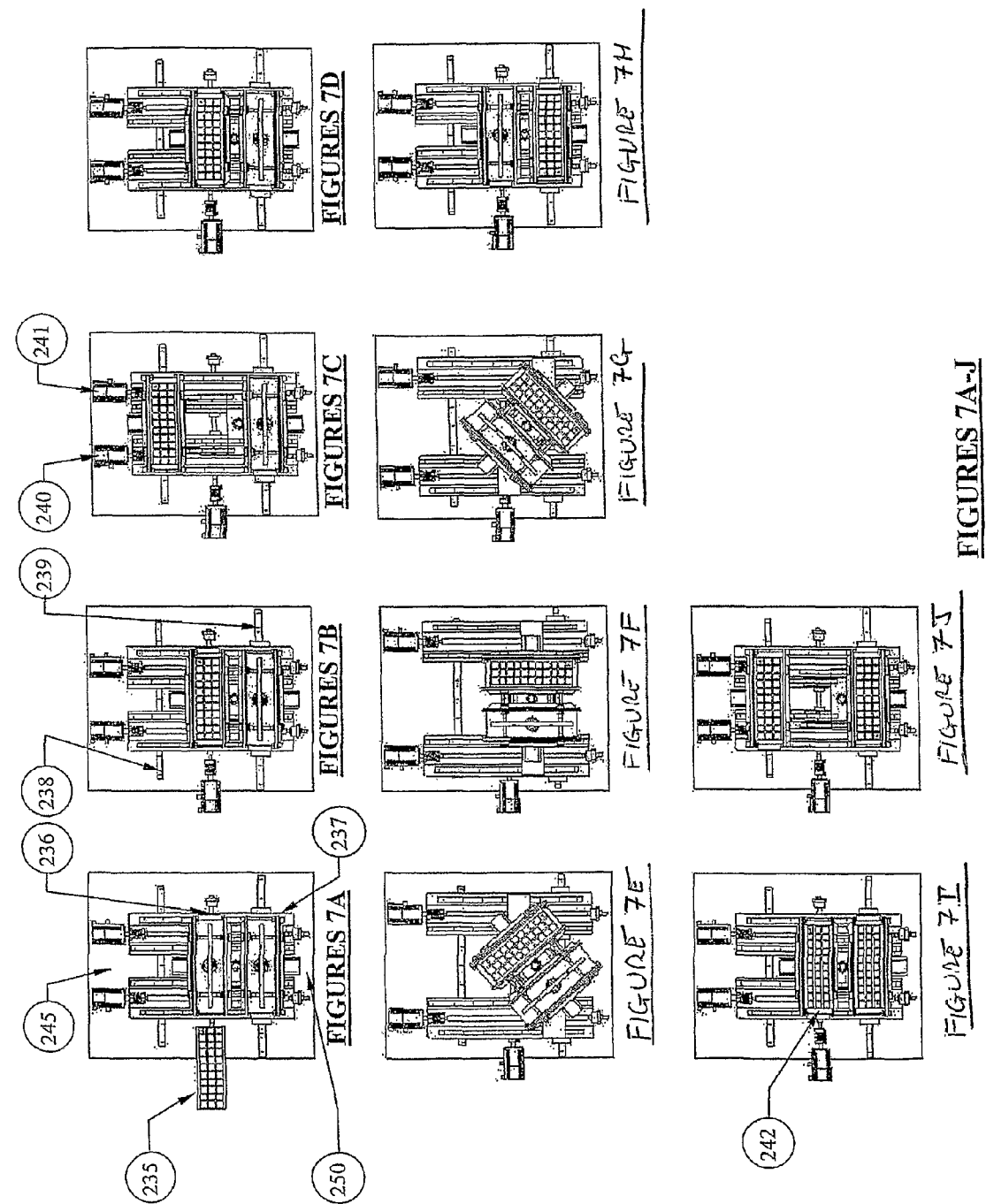
FIGS. 7A to 7J are sequential plan views of a twin conveyor in the process of mounting solder balls to a plurality of substrates according to one embodiment of the present invention.

The process implemented by the apparatus according to this embodiment is shown in the flow chart of FIG. 6 and the sequential plan views of FIGS. 7A to 7J. There is a set of conveyor pushers mounted on each of the conveyors. When a new substrate 235 is loaded, the conveyor pusher acts as a stopper with the stop position arranged such that the substrate location holes coincide with the top plate locating pins. The conveyor pushers are driven by stepper motor with feedback.

When the substrate is being lifted up by the substrate lifter to locate on the top plate, the conveyor pusher returns to its push position. The top plate has two locating pins which will precisely locate the substrate. Alternatively, the substrate is held by the lifter using a vacuum without the use of top plate. The fiducial vision registers the current substrate location. Next, the conveyor 236 will then move to the Flux Robot position 245 for flux to be deposited on the substrate.

The use of flux is to remove oxidation on the solder pad for better connectivity and bonding, and to hold the solder ball in place before the substrate is sent to the reflow oven to melt the solder ball to complete the bonding.

After the flux is deposited, and the conveyor returned to the central position, the twin conveyor will rotate 180° to bring the conveyor with flux nearer to the Ball Robot 250. The Ball Robot will then place the solder balls on the solder pad held in place by flux.

When the ball is being placed, the other conveyor of the Twin Conveyor is loaded with a new substrate 242 and flux is being placed by the Flux Robot 245. The conveyor then returns to the central position, and the twin conveyor rotates 180° again to bring the conveyor with the substrate with solder balls to align to the Input Conveyor and After Mount Inspection Conveyor.

The After Mount Inspection Conveyor will then move to the left to close up the gap between itself and the Twin Conveyor. The Conveyor Pusher pushes the substrate out into the After Mount Inspection Conveyor and stop at the stopper position to stop the new substrate pushed in by the substrate pusher at the Input Conveyor. The whole process then repeats itself for the subsequent substrates loaded to the conveyor.

Figure 5:
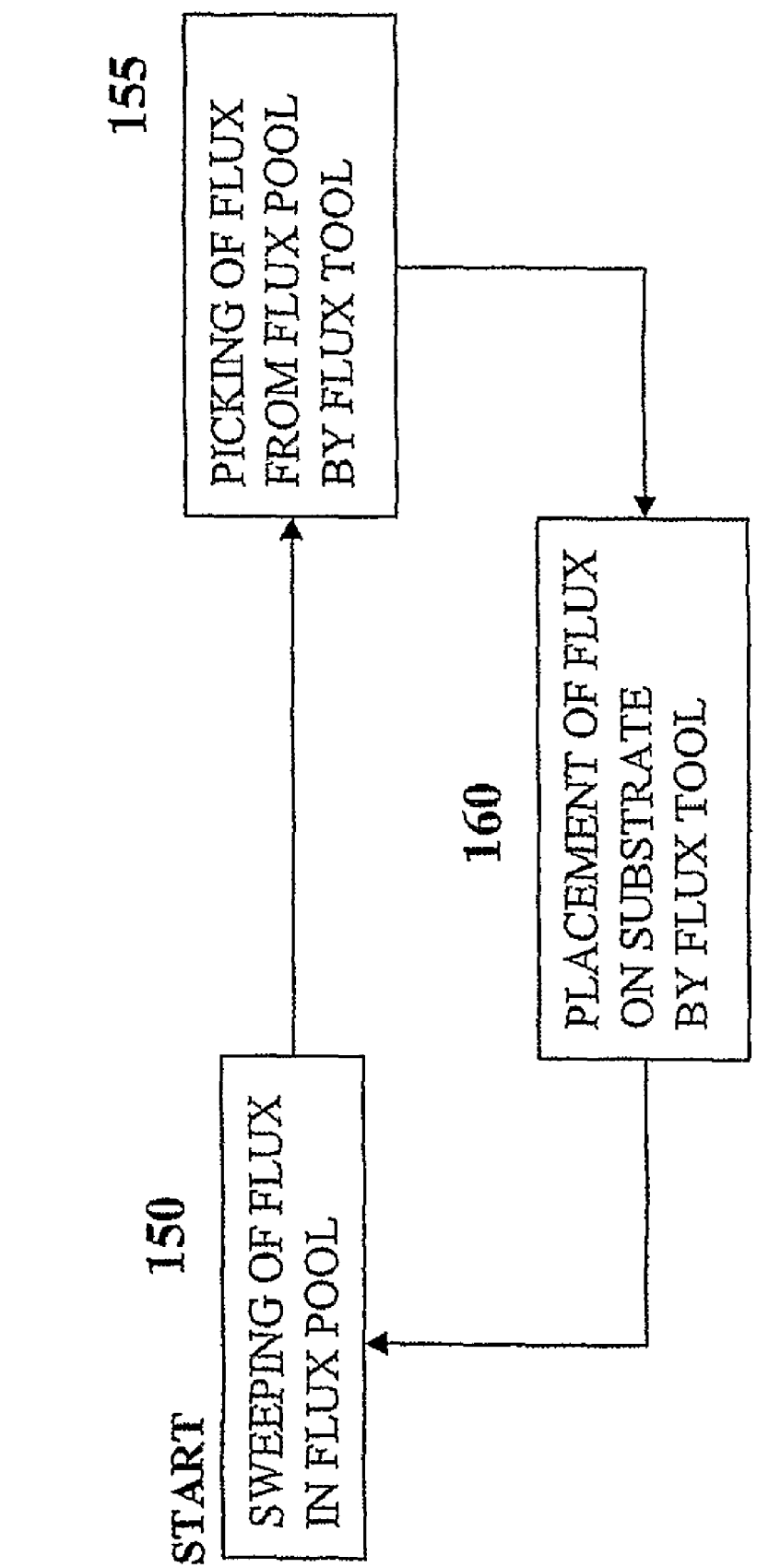
FIG. 5 is a flow chart of a flux depositing process according to one embodiment of the present invention.

FIG. 5 shows a flow path for the flux deposition method. The Flux Pool comprises a pair of sweeping flux applicators mounted on linear slide. The flux applicator will form a layer of flux which has predetermined thickness by setting the height of the applicator. The sweeping action 150 is driven by using speed control motor and the up/down motion is driven by a pair of air cylinders. During sweeping 150, one of the flux applicator will be at the down position at a fixed height from the flux pool to form a layer of flux with a certain thickness. This flux thickness controls the amount of flux pick up 155 by the Flux Tool and the subsequent amount of flux applied on the substrate 160.

The Flux Robot comprises X & Z slides and a Flux Process Head, which is mounted on the X & Z slides driven by two servomotors moving in the X direction and the Z direction. The Flux Process Head can rotate horizontally to compensate for theta error with the substrate and is also driven by a servomotor. The Flux Robot is mounted on a gantry for stable operation, with the Flux Process Head carrying the Flux Tool to pick up flux from the Flux Pool and deposit the flux on the solder pad of the substrate held in the R-Y twin conveyor.

The pattern of array of the Flux Tool corresponds to the pattern of the array of the solder pad on the substrate. The Flux Tool can be easy removable for converting to other product of substrate and for washing and maintenance. It comprises pins which are retractable so as to compensate for any warpage of the substrate and to ensure all the pins contact the solder pad to transfer flux to the solder pad. The retractable mechanism works by using either springs or sponge type material.

Figure 4:
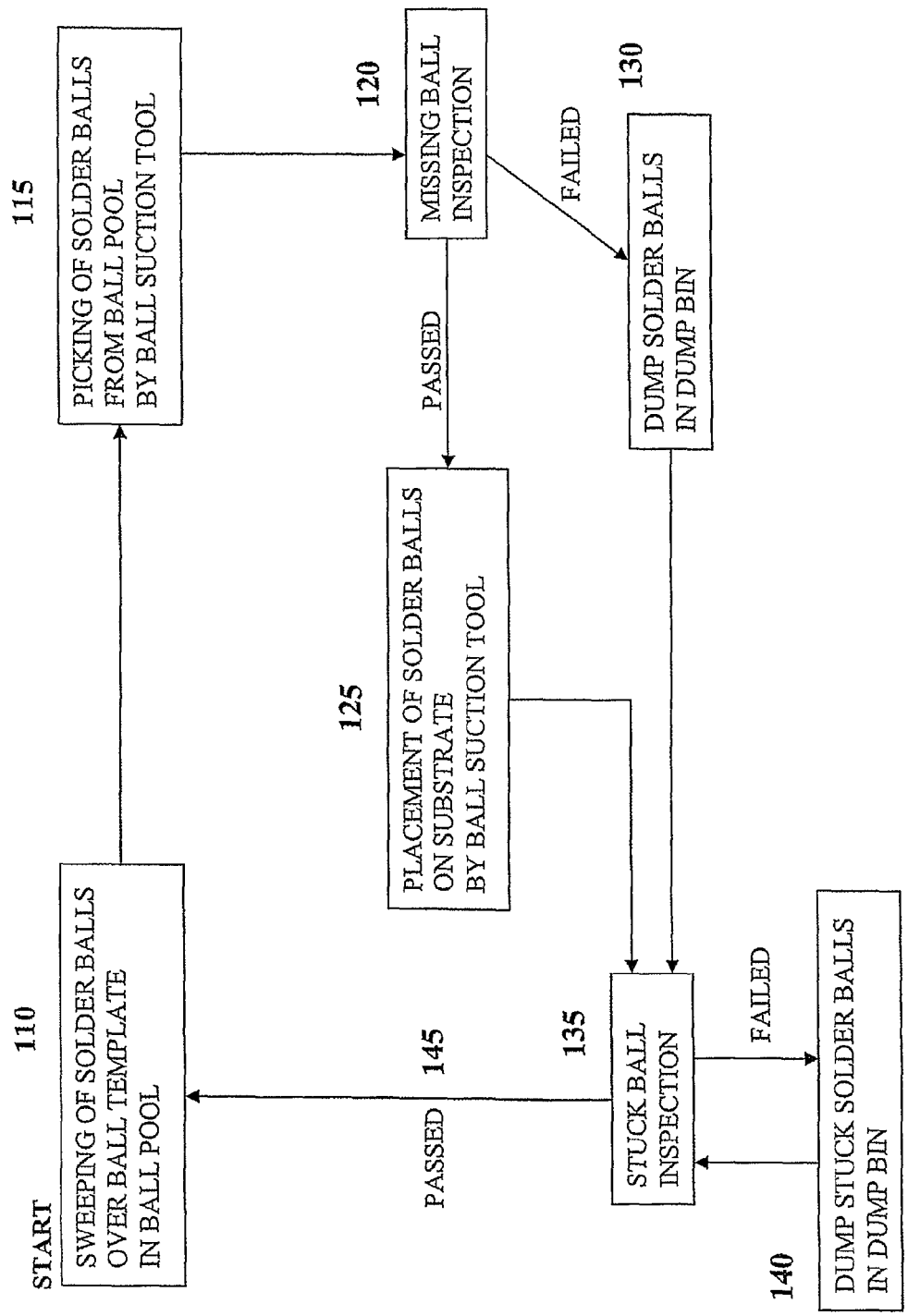
FIG. 4 is a flow chart of a ball positioning process according to one embodiment of the present invention.

As shown in the flow chart of FIG. 4, the Ball Pool comprises a solder ball container mounted on linear slide driven by speed control motor and a Ball Refill Module. The Ball Pool module is mounted on slides, which can move in Y direction driven by stepper motor with feedback. This allows fine adjustment to match the Ball Template to the Ball Suction Tool in Y direction. The solder ball container has an opened base where the solder balls will contact with a Ball Template 110. The Ball Template has vacuum apertures patterned in the same array as the solder pad in the substrate.

The vacuum apertures of the Ball Template will retain solder balls which will be picked up by the Ball Suction Tool 115. The Ball Template is easy removable for conversion of different product of substrate. The Ball Refill Module has a storage compartment for solder balls and it supply solder balls to the ball container for prolong operation without the assist of operator.

The Ball Robot 50 comprises X & Z slides and a Ball Process Head, which is mounted on X & Z slides driven by two servomotors moving in the X direction and Z direction. The Ball Process Head can rotate horizontally to compensate for theta error with the substrate and Ball Template and it is driven by servomotor. The Ball Robot 50 is mounted on a gantry for stable operation, and supporting the Ball Process Head which carries the Ball Suction Tool, having vacuum apertures patterned in the same array as the solder pads in the substrate.

The Ball Suction Tool may be removable for converting to other product of substrate. It picks solder balls by vacuum from the ball pool 115, move to Missing ball Inspection 120 and finally deposits the solder balls 125 on the solder pads of the substrate held in the R-Y twin conveyor.

After placing the solder balls on the substrate 125, the Ball Process Head will carry the suction tool to Stuck Ball Inspection 135. Both the Missing ball Inspection 120 and Stuck Ball Inspection 135 are in the path of picking and placing of solder balls which will reduce cycle time of the inspection.

The Missing Ball Inspection comprises an Infra-red emitter and an Infra-red receiver. The infra-red emitter is mounted in the Ball Process Head while the infra-red receiver is mounted in the path of the Ball Process Head from the Ball Pool to the R-Y Conveyor. Alternatively, the infra-red receiver may be mounted in the Ball Process Head while the infra-red emitter is mounted in the path of the Ball Process Head from the Ball Pool to the R-Y Conveyor.

After the Ball Process Head has picked up the solder balls from the Ball Template on the Ball Pool, it will pass through the infra-red emitter or receiver. If there is no missing ball, the infra-red will not pass through the vacuum apertures and the infra-red receiver will registered nominal voltage, the machine system will show that missing ball inspection has passed. If there is any missing ball, the infra-red will pass through the vacuum apertures and the infra-red receiver will registered higher voltage, the machine system will show that missing ball is detected and the system will dump the solder balls and check for stuck balls before re-picking the solder balls. If after re-pick, there are still missing balls, the machine system will prompt for operator assistance.

The Stuck Ball Inspection comprises a pair of laser emitter and laser receiver mounted horizontally in the path of the Ball Process Head from the R-Y Conveyor to the Ball Pool. After the Ball Suction Tool had placed the solder balls on the substrate, the Ball Process Head will carry the Suction Tool through the laser beam at a predetermine height. If there is a solder ball stuck on the suction tool, the laser beam will be partially blocked and the reading of the laser receiver will show a weaker strength of the laser beam and output a signal that stuck ball is detected on the Ball Suction tool.

The Suction Tool will try to dump the stuck solder ball in the Dump Bin 140 and re-inspect the suction tool again, if stuck ball is still detected, the system will stop and prompt for operator to assist. If there is no solder ball stuck on the Suction Tool, there will be no change in the reading of the laser receiver and the machine system will show that stuck ball inspection has passed.

The After Mount Inspection 31 (AMI) comprises a camera 105 with low angle ring light 100 mounted stationary. The camera is a line scan camera which will capture an image of an object while on the fly and the object position is feed back to the vision system by a linear encoder. The line scan camera has an advantage where it can capture large image at one time which is much faster than a normal area scan camera which need to take a few shots of the large object. The camera will capture the image of the substrate when it scan the substrate position by the linear encoder while the substrate is being moved along under the camera with the low angle ring light switched on. The vision inspection will check for missing balls, extra balls, ball diameter, ball pitch and ball to pad distance.

The After Mount Inspection Conveyor comprises a pair of guide rails with driving belts, substrate lifter and process top plate mounted on linear slide driven by speed control motor. The width of the guide rails is adjustable by stepper motor with feedback and it corresponds to the width of the substrate that is keyed into the product recipe during initial setup. Before the substrate is pushed into the AMI 31 conveyor from the R-Y conveyor, AMI Conveyor will move towards the left to close up the gap between itself and the R-Y Twin Conveyor. The gap is necessary to avoid interference with the rotation of the R-Y Twin Conveyor.

On the AMI conveyor, the substrate will be lift up by the substrate lifter to locate on top plate. The top plate will move under the line scan camera for image capturing. The top plate is connected to a linear encoder to feedback the position of the substrate while the camera is capturing the image. After vision capturing, the substrate will be lower on the conveyor and the driving belts will move the substrate downstream to the Multi Lane Distributor 35.

The Multi Lane Distributor 35 comprises a pair of guide rails with driving belts and substrate pusher, which is mounted on a linear slide driven by stepper motor with feedback. The width of the guide rails is adjustable by a stepper motor with feedback and it corresponds to the width of the substrate that is keyed into the product recipe during initial setup. After vision inspection, the passed substrate will be sent downstream to the Reflow Oven while the failed substrate will be send to the Reject Module 32.

The Reflow Oven comprises a slow moving broad metal chain conveyor that carry the substrates through the different heating and cooling zone of the oven. The Multi Lane Distributor will spread the substrate on the broad conveyor of the Reflow Oven by indexing substrate to different position lane on the conveyor. Typically, depending on the width of the substrate, 3 to 5 lanes are used to spread the substrates evenly on the conveyor of the reflow oven. The rejected substrate is then transferred to the Reject Module 32 for the operator to rework.

Additional features that may be added to the apparatus and process include:
- a Reflow Oven for melting the solder ball to complete the bonding to the solder pad;
- a Washer Machine to wash and dry the substrates to remove flux and any contaminants;
- Offloader, which comprises a Nestling Conveyor, Multi Lane Consolidator, Offload Conveyor, Buffer Bin and Magazine Handler.
- The Nestling Conveyor comprises a set of rollers in 3 to 5 lanes depending on the substrate width. The substrates will roll into the lanes of rollers from the washer machine. The substrates will be stopped by the stopper in each lane until the Multi lane consolidator is indexed to the lane and the stopper is lowered to allow the substrate to be transferred over.

The Multi Lane Consolidator comprises a pair of guide rails with driving belts, which is mounted on a linear slide driven by stepper motor with feedback. The width of the guide rails is adjustable by stepper motor with feedback and it corresponds to the width of the substrate that is keyed into the product recipe during initial setup. The Multi Lane Consolidator will receive the substrates from the different lane of the Nestling conveyor by indexing to the individual lanes.

After receiving the substrate, it will index to the Offload conveyor and the stopper is lowered to allow the substrate to transfer over to the Offload conveyor.

The Buffer Bin comprises a metal tray for the collection of substrates when there is no empty magazine or an error has occurred at the Magazine Handler. The purpose of the Buffer Bin is to prevent jam up at the Nestling Conveyor as the conveyor of the Reflow Oven and the Washer Machine will continuously feed substrates to the Nestling Conveyor.

The Offload Conveyor comprises a pair of guide rails with driving belts and substrate offload pusher. The width of the guide rails is adjustable by stepper motor with feedback and it corresponds to the width of the substrate that is keyed into the product recipe during initial setup. The Offload Conveyor receives the substrate from the Multi lane consolidator and then sends it to the magazine by the offload pusher.

The Magazine Unloader comprises an upper stage, lower stage and magazine clamp. The Upper stage is where empty magazines or cassettes are inserted. The rubber belt driven by the rollers and motor will move the empty magazine towards the magazine clamp. The magazine clamp will then pick up the magazine and index first substrate slot to the Offload Conveyor.

The Offload Pusher pushes the substrate into first substrate slot in the magazine. The magazine clamp will then index to the next substrate slot. This process repeat until the magazine is full. Once the magazine is full, the magazine clamp will place the full magazine on the lower stage where the full magazines can be removed by the operator.

Referring to FIGS. 8 and 9A to 9G, there is shown a rotary conveyor 260 for selectively moving an object through a combination of translation and rotation. Whilst applicable to the device and method described above, the rotary conveyor 260 is also applicable to a range of applications distinct from the solder ball device of the present invention. In this sense, the device will be described separately from the aforementioned device and method. It will, nevertheless, be understood by the skilled addressee that the rotary conveyor 260 according to this aspect of the invention will fulfil the requirements of the conveyor 65 as previously described.

Figure 8:
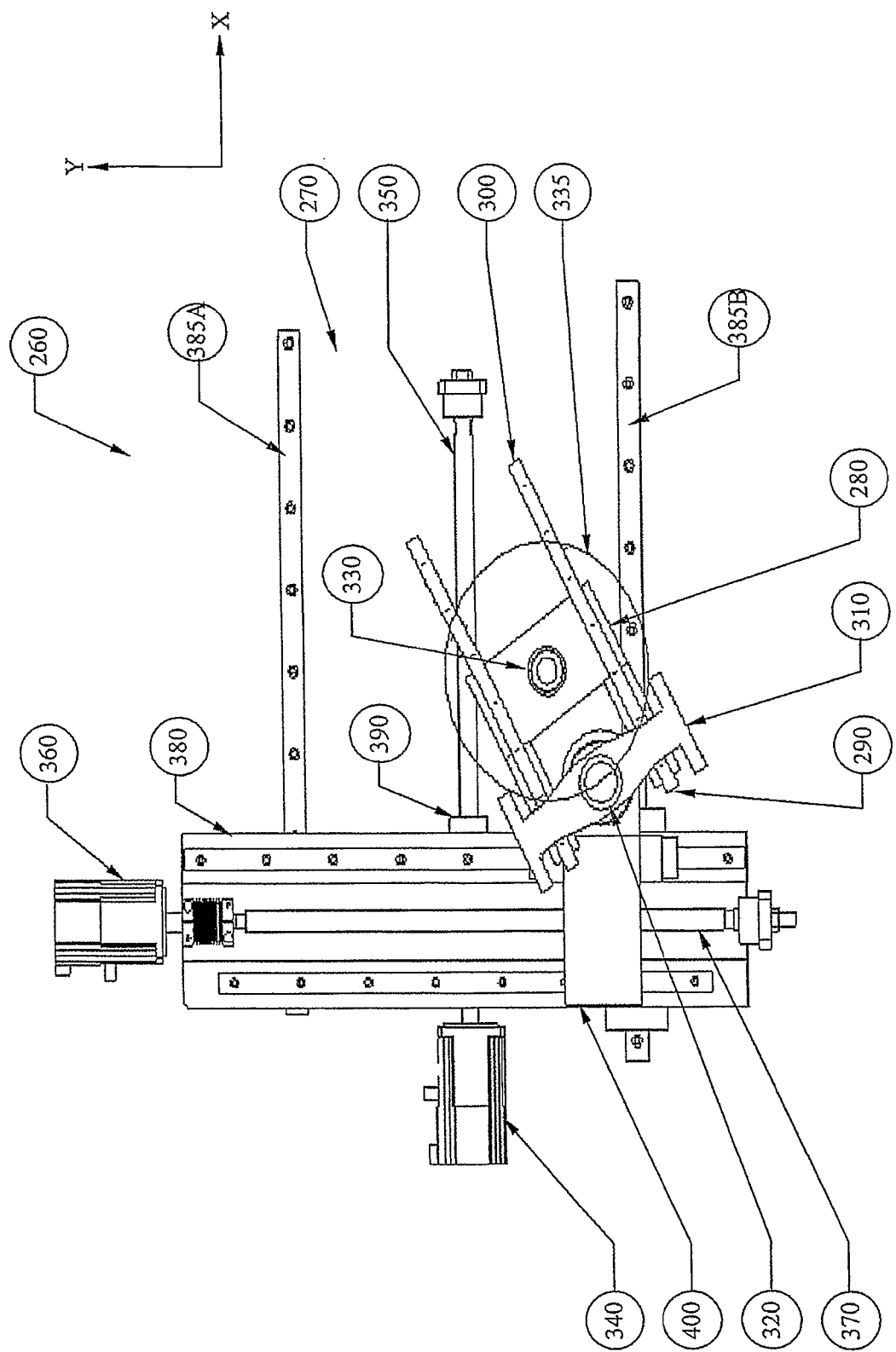
FIG. 8 is a plan view of a rotary conveyor assembly according one embodiment of the present invention.

FIG. 8 shows one half of the total rotary conveyor assembly, omitting the other half for clarity. It will be appreciated the following discussion is applicable to the second half, which act together to provide the efficiencies of the overall assembly 260.

The rotary conveyor assembly 260 according to this embodiment comprises a rotary link 270 which rotates about a fixed point 330. The rotary link 270 further includes a slide 280 upon which is located a conveyor mounting 310. When the assembly 260 is applied to the solder ball mounting device and method, the conveyor mounting is adapted to receive and transport substrates. Otherwise, the conveyor mounting 310 will be applicable to the engagement of other objects according to the intended use.

The conveyor mounting 310 is placed adjacent a first end 290 of the slide 280, which is also adjacent to the rotary conveyor's engagement with a bracket 400 of an actuator 360 aligned with the Y axis. The centre point 320 of the conveyor mounting 310 defines a floating point through which motion of the rotary link 270 may be described. In particular, and as will be described below, the movement of the floating point 320 defines a circular path 335, in this embodiment. It will be appreciated that, in arrangements falling within the scope of the invention, that the path 335 may define a range of different shapes according to the desired application.

Not shown is an identical conveyor mounting which may be positioned at the opposed end 300 on another set of slides, which in turn would be engaged with a similar actuator (not shown).

The Y-actuator 360 biases the rotary link 270 through a screw thread arrangement, whereby a ball screw 370, within a base plate 380, is rotated by the Y-actuator 360. The bracket to which the rotary link 270 is mounted engages the ball screw 370 through a corresponding screw thread engagement. By preventing rotation of the bracket 400, actuation by the Y-actuator 360 rotates the ball screw 370 which in turn results in linear motion of the bracket. The rotational mounting of the bracket 400 with the rotary link 270 consequently leads to, at least partially, rotation of the link 270.

The assembly 260 further includes an X-actuator 340 which is mounted to the base plate 380. The base plate 380, as well as the Y-actuator 360 is free to move along guides 385A, B. The base plate 380 is mounted to the X-actuator 340 and guides 385A, B in a similar manner to the Y-actuator 360 is mounted to the bracket 400, that is, by a ball screw 350. Accordingly, actuation by the X-actuator 340 causes linear movement of the base plate 380 and Y-actuator 360 along the guides 385 A, B. It follows that, the X-actuator 340, will therefore influence the movement of the rotary link 270 through biasing of the base plate 380 and Y-actuator 360.

FIGS. 9A to 9G show a sequence of movement of the rotary conveyor assembly 260. As with FIG. 8, the other half of the conveyor 260 has been omitted for clarity.

The process commences with the conveyor mounting 310 in a first position which in this case is directed downwards along the Y-axis. The bracket 400 is placed in the fully extended position along the Y-axis by the Y-actuator 360. The base plate 380 is placed in the left position of its intended path by the X-actuator 340 so that slide 280 is parallel to the Y axis.

The slide 280 is retracted maintaining the conveyor mounting 310 in the aforementioned first position.

FIG. 9B shows the change in position of the components following biasing both the X and Y actuators 340, 360. The Y-actuator 360 has partially retracted the bracket with the X-actuator 340 partially retracting the base plate 380. This leads to the rotary link 260 rotating, in this case, about 45°. The slide remains in the retracted position, and thus the conveyor mounting 310 follows the circular path 335.

Further biasing by the actuators 340, 360 rotate the rotary link 270 through to 90° (FIG. 9C). By reversing the direction of the X-actuator 340, the base plate 380 is extended, whilst simultaneously retracting the Y-actuator 360. This results in the conveyor mounting 310 first rotating to 135° (FIG. 9D) and then to 180° (FIG. 9E), such that it is directed along the Y-axis.

In this position, the actuators 340, 360 are fixed. Subsequently, the slide 280 is progressively extended (FIGS. 9F, 9G) so as to move the conveyor mounting 310 outside of the circular path 335 followed in previous steps. Here, the conveyor mounting 310 may deliver an object to a station isolated from the rotary conveyor assembly 260, or alternatively permit an object to undergo a process whilst within the mounting or receive a further object.

It will be appreciated that, whilst the above process is taking place, a conveyor mounting on the opposite side (not shown) is similarly moving an object in reverse. Consequently, the rotary conveyor assembly controls the processing of two objects simultaneously, with the effect of, inter alia, reducing bottlenecks.

It will be appreciated that the rate and extent of extension and retraction by the actuators controls the path followed by the conveyor mounting. Accordingly, variation of these rates and movements may define different shaped paths including an elliptical path, rectangular path or even one following a sinusoidal path.

It will be further appreciated that the actuators can be either lead screws or ball screws or belt mechanism driven by servomotors or linear motors with linear encoders.

Further still, it will be appreciated that, in this embodiment, the mechanism uses two actuators, instead of the usual three, to operate with three degrees of freedom (X,Y,θ).

Figure 10A:
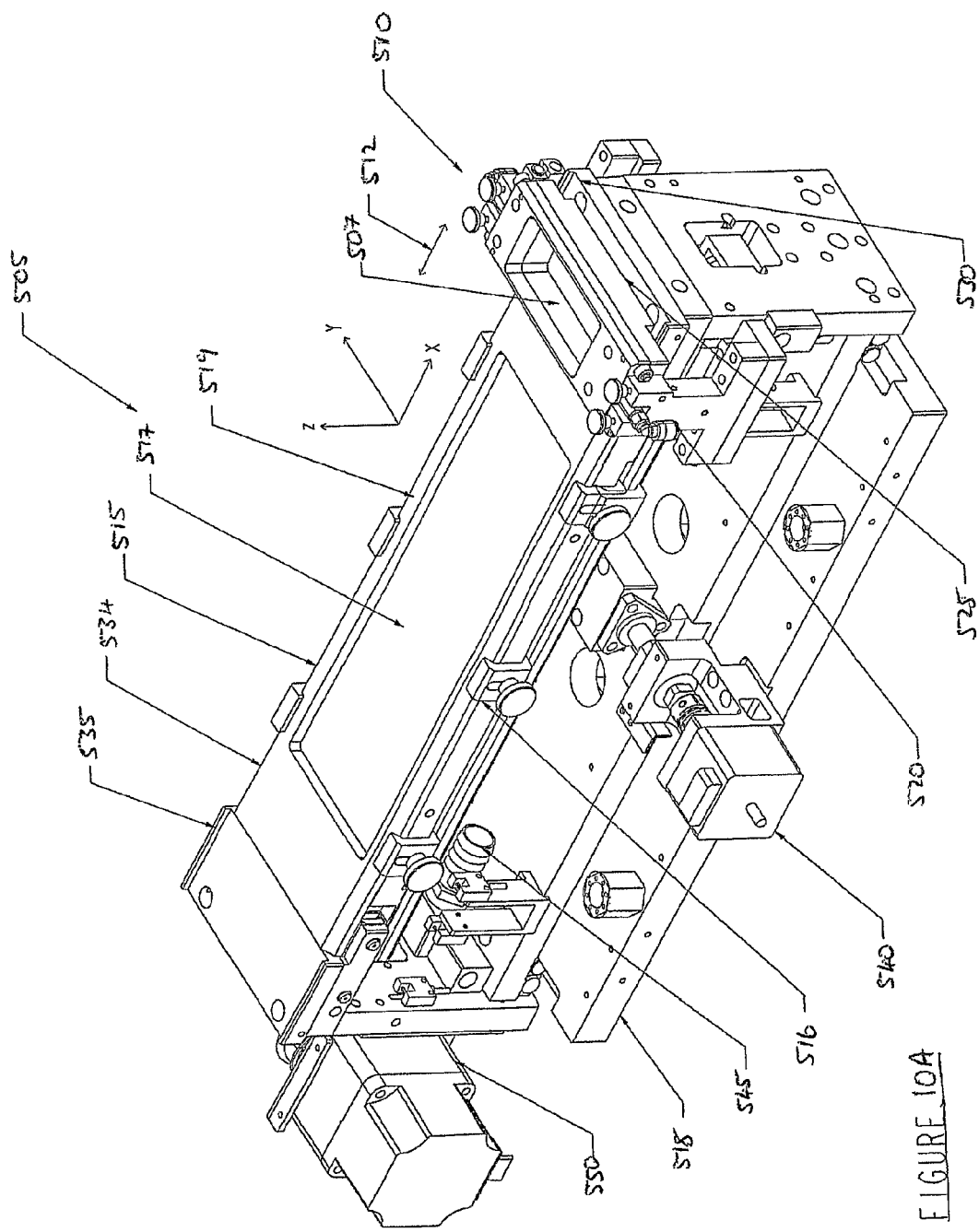
FIG. 10A is an isometric view of a solder ball preparation module according to a further embodiment of the present invention.
Figure 10B:
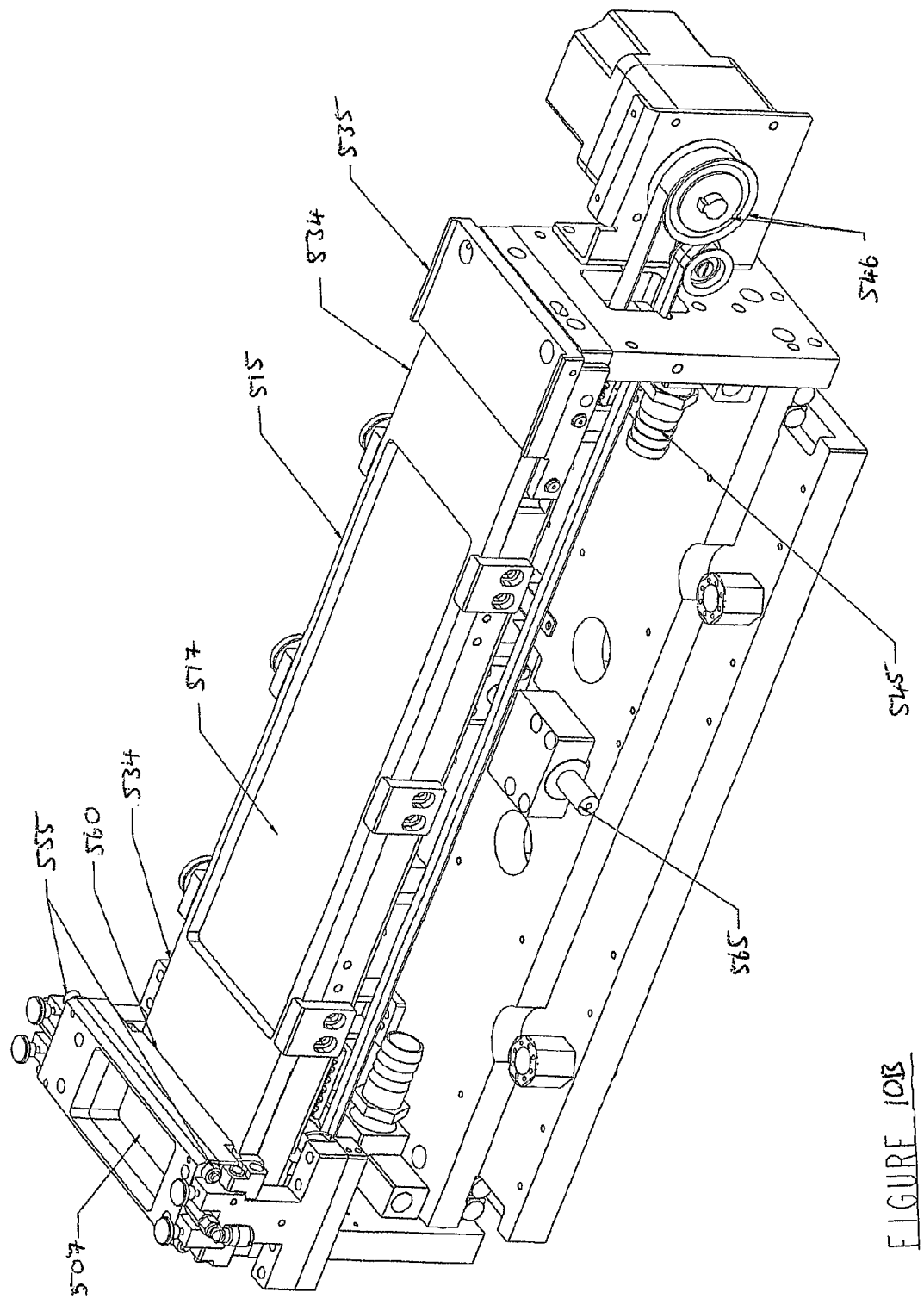
FIG. 10B is an isometric reverse view of the solder ball preparation module of FIG. 10A.
Figure 10C:
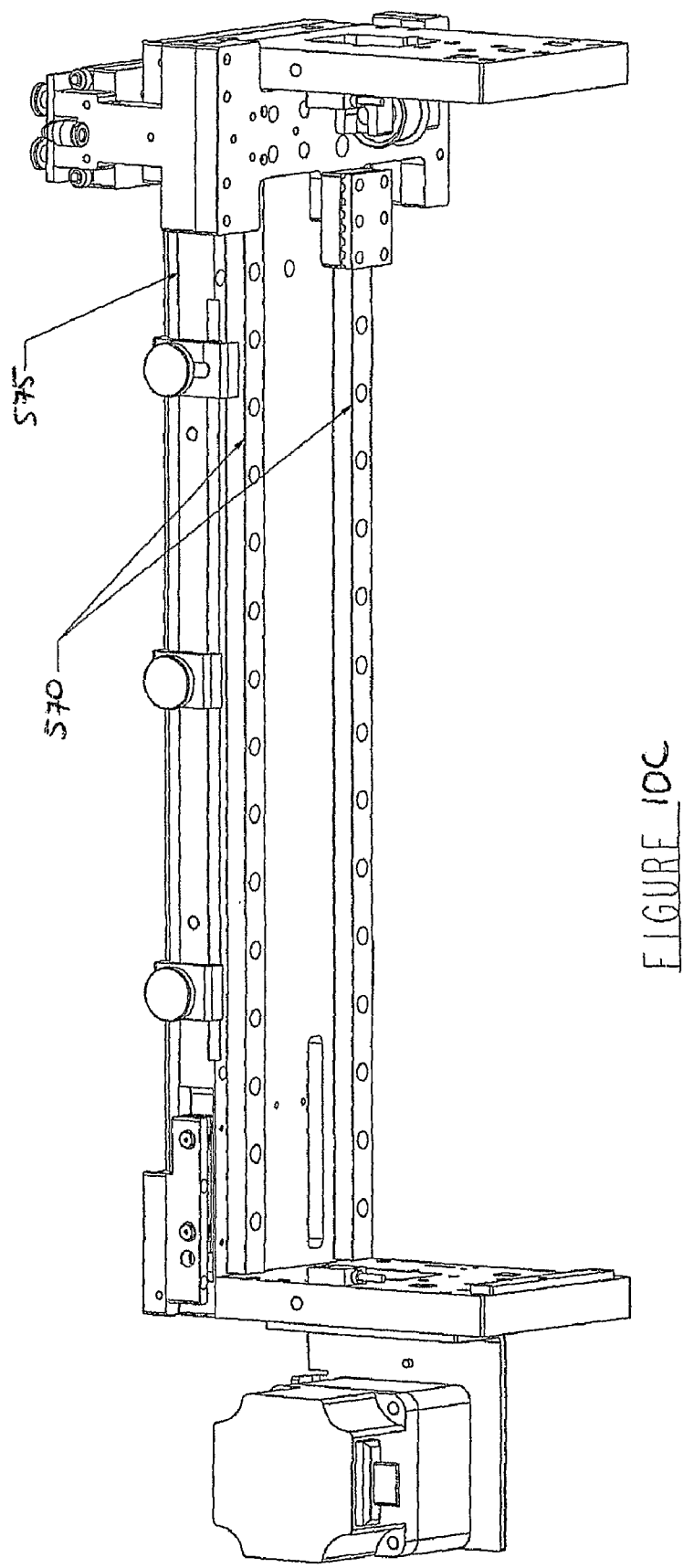
FIG. 10C is an isometric underside view of the solder ball preparation module of FIG. 10A.

FIGS. 10A to 10C show a solder ball preparation module 505 according to one embodiment of the present invention. The module comprises a solder ball template 515 mounted by brackets 516 within a housing 518. The solder ball template is adapted to receive a quantity of solder balls from a solder ball reservoir 510 for holding in a predetermined array arrangement within a recess 517.

The solder ball reservoir 510 includes a void 507 into which solder balls are loaded for distribution to the solder ball template 515 as it sweeps 512 longitudinally along the X axis along the template 515. The solder ball reservoir 510 in particular comprises a reservoir housing 525 encapsulating the void 507.

The solder ball reservoir 510 is arranged to be supported along a fluid interface between the template 515 and the solder ball reservoir 510. The fluid interface is created by a fluid interface device which substantially comprises an inlet 520 for receiving compressed air. This is communicate through air columns (shown in FIG. 11A) which bear against a running surface 519 of the template so as to separate the solder ball reservoir 510 from the template 515 by a predetermined air gap. In a preferred embodiment, this air gap may be of the order of 0.3 mm but in any event will be determined based upon the size of the solder balls being distributed by the solder ball reservoir 510. Accordingly the gap may be as small as 50 microns and can be established by one skilled in the art who will be able to determine the optimum gap based upon the solder ball diameter.

The solder ball reservoir 510 is arranged to sweep 512 in the longitudinal direction by use of the pulley belt arrangement 546 which is controlled by speed control motor 550. Thus whilst the fluid interface maintains the predetermined gap, movement to achieve the sweeping 512 effect is achieved by the speed control motor along linear slides 570.

Further, the template 515 is capable of lateral movement (Y-axis) relative to the solder ball pickup head (not shown) by operating a stepper motor 540 in communication with a lead screw 565 mounted between the housing 518 and the template 515. Thus, to further accommodate fine adjustments, the stepper motor can effect precise movement through use of this arrangement. An advantage of providing the brackets 516 so as to secure the template 515 provides for the template 515 to be readily removable from the device 505. Thus the device 505 can be used for a range of different substrates by merely replacing the template 515 so as to have different templates mountable within the device to match different substrates types.

A feature of the template 515 is the addition of end zones 534 at opposed ends of the template, such that the "run" of the reservoir 510 includes not just the template 515 but also the end zones 534. This provides a number of advantages including ensuring that the range of distribution of the solder balls is maintained and not compromised by deceleration and acceleration of the reservoir 510 as it approaches the end of its run. By having the array 517 in a central portion of the full length of the run, the rate of distribution can be constant for its full length with any acceleration issues isolated from the distribution of solder balls by the provision of these end zones 534. Also, the template 515 may not match the end plates 535 flatness perfectly due to warping of the template after prolonged usage. By minimizing the "run" of the reservoir 510 over the end plate 535, damages to the solder balls and reservoir housing 525 are reduced.

The device 505 further includes end plates 535 over which the reservoir can be positioned so as to permit removal of the template 515. Thus the reservoir will only move to the end plates at the end of the machine run so as to permit maintenance or as mentioned, replacement of the template.

With reference to FIGS. 11A to 11C, there is shown the solder ball reservoir housing 525 with the various components removed for clarity. As can be seen, the reservoir housing 525 encapsulate the void 507 so that on sweeping movement 512 along the template 515, the solder balls can pass through the reservoir directly onto the template and so accurately form the array within the recess 517 of the template 515.

The fluid interface device according to the present invention is embodied here through an air inlet into channels within the reservoir housing 525 and exiting through air columns 580 which are directed downwards onto the running surface 519 of the template. It follows that the gap can be adjusted through adjusting the flow of air through the air column 580 which are housed within recesses 581 to control said flow.

The datum from which the air gap is measured is from the running surface 519 of the template 515. As no physical contact is made between the reservoir housing 525 and the surface 519, the actual surface preparation of the surface 519 is immaterial to the maintenance of the air gap. This is in contrast with a system that would have the housing 525 running across the template by contact with any part of the entire module 505. The machining of the device, required to maintain the gap, must be to a particularly high tolerance given the required gap in order to achieve the requisite quality. Such a high degree of tolerance in machining is not required for the arrangement according to the present invention because of this lack of contact between the reservoir housing 525 and the template 515. To this end the linear slide and housing 518 of the module similarly can be manufactured to a normal tolerance which consequently will significantly reduce the manufacturing costs of the device.

In a further embodiment of the present invention in the case of variation in the air pressure or subsequent completion of the array, a step 585 arranged on the under surface 590 of the reservoir housing 525. On removal of the air pressure, the reservoir housing 525 will drop down to be in contact with the running surface 519 of the template. The step 585 on the under surface 590 will, therefore, maintain a clearance with that portion of the under surface 590 directly above the solder ball array 517. And so this preferred embodiment, a further safeguard is provided to prevent contamination or damage to the solder ball array 517. It follows further that should the solder ball reservoir 510 be interfered with, such as by an operator touching the reservoir housing 525 and so overcoming the air pressure maintaining the air gap, the reservoir housing 525 cannot be pushed into the solder ball array 517, preventing accidental damage.

A further advantage of providing this fluid interface includes a reduction in maintenance and increase in commercial life of the device. Because of a lack of contact surface, that is the reservoir housing 525 remains clear of the template 515, surfaces which under normal circumstances would require a high tolerance and therefore suffer wear more rapidly in fact do not suffer wear.

The air columns 580 shown in FIG. 11A are represented as slots 581 in which are located a plurality of apertures. The slots 581 are located at opposed ends of the underside face 590 so as to correspond with the running surface 519 of the template. It will be appreciated, however, that this air column may be represented in a different arrangement according to the required air flow in order to maintain the fluid interface. Thus while FIG. 11A shows two elongate slots with the apertures corresponding to these slots, many other arrangements will also fall within the scope of the invention as will be appreciated by the skill addressee.

FIGS. 12 and 13 show adaptor plates for mounting to solder ball placement machines (not shown) which facilitate the mounting of a variety of devices including solder ball and flux pick up heads. In the absence of a single industry standard, mounting fixtures can vary from manufacturer to manufacturer. The adaptor plate according to this embodiment solves the problem of the lack of industry standard by the facilitation of mounting of a variety of manufacturers' devices. FIGS. 12A and 12B in particular, are intended for use with a solder ball pickup providing a range of features which both facilitate attachment as well as ensuring secure mounting. In particular the adaptor plate 605 comprises an aluminum body 610 with a central orifice 615. Set within the body 610 are locating holes 630 into which projections from the various devices may be inserted. Within each locating hole 630 are steel bushings 635 which can be readily replaced should the projections from different manufacturers vary considerably. In any event the steel bushings 635 can be manufactured over a wide specification so that they can accommodate projections of different size or shape for an individual bushing. The bushings are made of steel so as to provide a high degree of abrasion resistance as compared to the aluminum body 610. Further, because they are replaceable and relatively cheap, the aluminum body 610 remains intact, in keeping with its relatively expensive manufacture whilst replacing the steel bushing either for accommodating different manufacturers' devices or for replacing overly worn fixtures. Further, the tool lock 650 can be replaced should it be necessary to accommodate a particular manufacturer's specification. Accordingly the tool lock 650 will be selected so as to meet as wide a range of manufacturing connections as possible. Further, the tool lock 650 can be replaced with other standard devices to broaden the applicability of the adaptor plate 605 without the excessive costs of manufacturing a new body 610 for each variety.

To ensure correct placement, the body 610 also includes locating pins 640 to be inserted within specific recesses within the required machines. A resilient engagement portion such as the press fit device 620 having spring loaded projections 625 which can be used to press fit into the relevant devices and be held in place securely and accurately but without time consuming fasteners. Whilst the adaptor plate 605 is securely mounted within the device using the press fit portion 620, the spring loaded projections 625 allow it to be quickly removed and replaced or to be modified such as replacement of the tool lock 650 or steel bushings 635.

The adaptor plate 605 as shown in FIGS. 12A and 12B require the provision of a vacuum supply and accordingly the aluminum body 610 incorporates a vacuum inlet 655 in one face of the adaptor plate which receives the vacuum supply through a plurality of vacuum holes 645. In this embodiment there are eight such vacuum holes 645 equally spaced around the opposed face of the adaptor plate 605 with internal channels (not shown) maintaining communication between the vacuum holes 645 and the vacuum source 655. Thus by a simple press fit the adaptor plate 605 can be fitted to a solder ball pick up and in an appropriate device attached thereto.

The arrangement is equally applicable to a flux pick up as shown in FIGS. 13A and 13B whereby the locating holes 630 with steel bushings 635 are also present. Further the locating pins 640 and tool locks 650 are also present for attachment to the various devices. Further still, the advantages of a press fit device are provided for a similar resilient portion 630 with spring loaded projections 625.

Because the vacuum source is not required for the flux pick up, the adaptor plate 665 does not incorporate the vacuum source features of the adaptor plate 605 of the solder ball pick up. However, the body 680 of the flux pick up adaptor plate 665 does incorporate void 685 within the body 680 similar to voids 660 in the body 610 of the solder ball pick up adaptor plate 605. Because of the lack of vacuum source required for this application, the voids 685 can accordingly be larger and, therefore, further reducing the weight of the adaptor plate 605.

Figure 14:
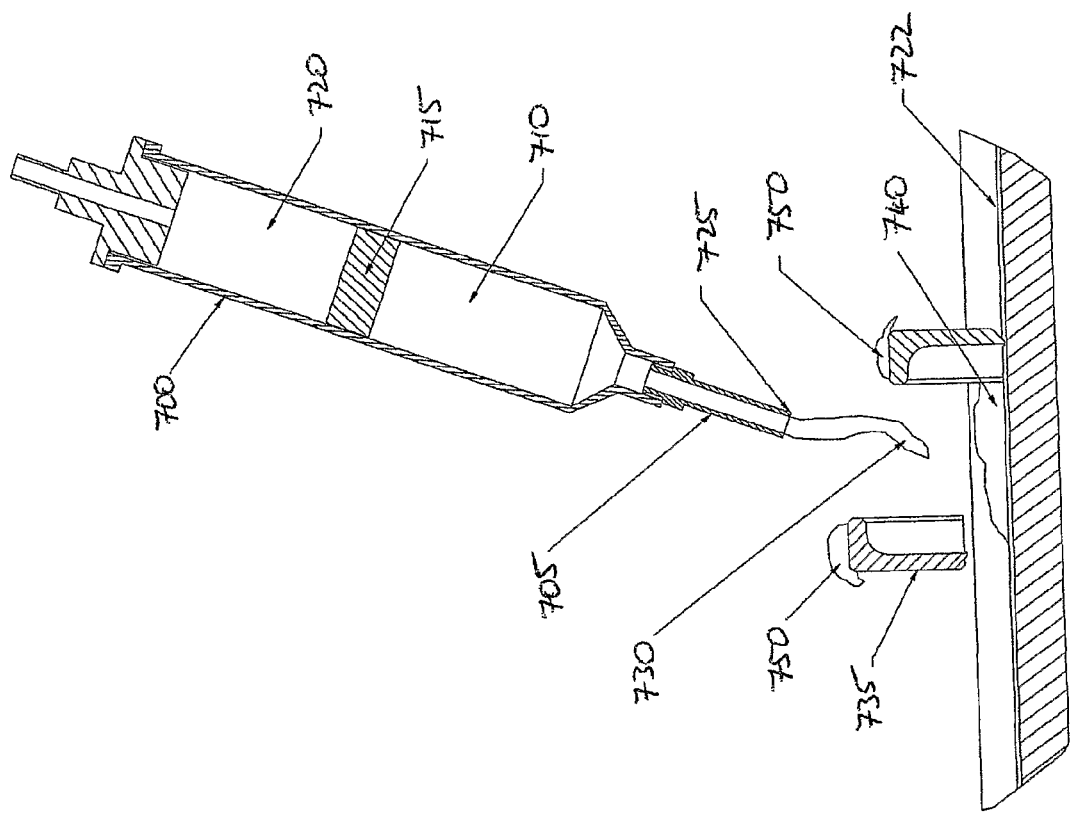
FIG. 14 is an elevation view of the operation of a flux refiner of the prior art.
Figure 15:
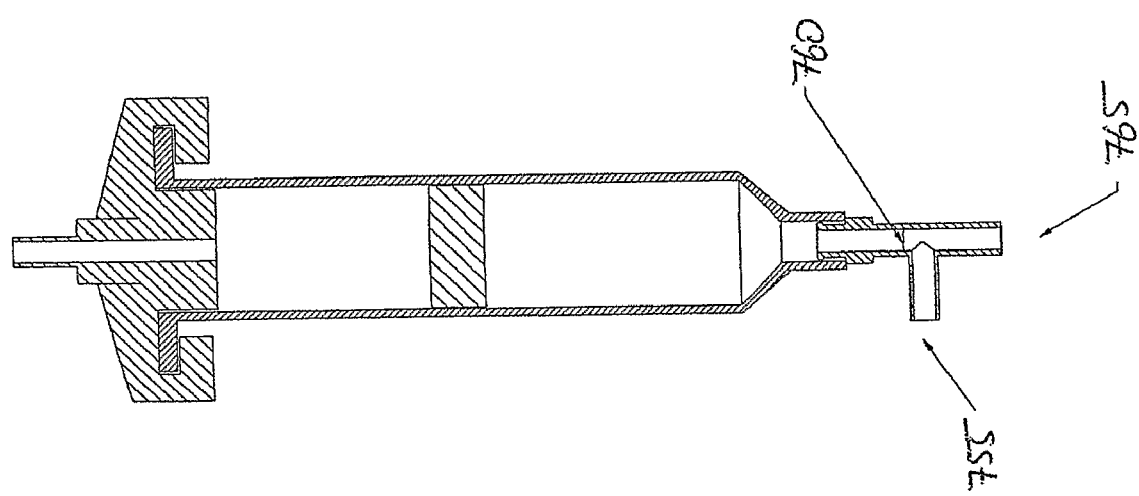
FIG. 15 is an elevation cross sectional view of the flux refiner according to a further embodiment of the present invention.

FIG. 14 shows an arrangement where flux 710 is delivered to a flux pool 740 on a plate 722. The intention is for flux applicators 735 to be lowered to a set height and sweep 745 across the flux pool 740 whilst on the plate 722 and so smooth out the flux pool 740 to a known thickness for collection and delivery to the substrate. This is typically achieved by a syringe 700 having the flux 710 within a containment chamber. Pressure 720 is applied to the flux 710 through a plunger 715 which is forced downwards by air pressure. Consequently flux 710 is forced into an exit chamber 705 to exit through nozzle 725 thus delivering flux 730 to the flux pool 740. The difficulty arises in that after the pressure 720 is removed, flux still remains within the exit chamber 705 and, subject to gravity, can drip in an uncontrolled manner so as to lead to contamination by dropping flux 750 onto various components such as the flux applicator 735. This contamination can be transferred to subsequent flux pools which may then be transferred to substrates leading to significant wastage of product during attachment of the solder balls. As the flux is sticky, it can attract foreign particles which will affect the accuracy of the placement of the solder balls. Also if flux is being accidentally deposited on either the Solder Ball Pickup Head or the Solder Ball Reservoir, the operation of the whole machine will be affected as the flux contaminated solder balls will attached to any surface that it comes into contact with. FIG. 15 shows a solution to this problem by the introduction of a second pressure source 755 which injects air pressure directly into the exit chamber 705. The injection of air through the inlet 755 blows out the excess flux from the nozzle under a controlled environment such as into a waste bin or if the pressure through the inlet 755 is sufficiently controllable, emptying the remaining flux into the flux pool 740. The result is the lower most portion of the flux 760 being above the inlet 755 leaving the exit chamber substantially clear 765 such that no flux can drip in an uncontrolled manner. Accordingly the addition of the second pressure source through the inlet 755 avoids significant problems involved in contamination through uncontrolled dripping of flux.

The invention claimed is:

1. A method of mounting an array of solder balls to at least one substrate of integrated circuits, comprising the steps of:
   delivering a first substrate to a first plate in a loading position; subsequently
   laterally translating the first plate to a flux receiving position; subsequently
   applying flux to said first substrate; subsequently
   returning said plate to the loading position; subsequently
   rotating the first plate 180° such that the first plate is in a solder ball receiving position; and then
   mounting solder balls to the first substrate.

2. The method according to claim 1, wherein the rotating step comprises:
   simultaneously rotating a second plate, with the first plate, such that the first plate is in a ball receiving position, and the second plate is in the loading position.

3. The method according to claim 2, further comprising the steps of:
   delivering a second substrate to the second plate whilst in the loading position;
   laterally translating the second plate to the flux receiving position;
   applying flux to said second substrate; and
   returning said second plate to the loading position.

4. The method according to claim 3, further comprising the steps of:
   simultaneously rotating the second and first plates, such that the second plate is in the ball receiving position, and the first plate is returned to the loading position;
   mounting solder balls to the second plate; and
   demounting the first substrate from the first plate.

5. The method according to claim 4, further comprising the steps of:
   delivering a third substrate to the first plate whilst in the loading position;
   laterally translating the first plate to the flux receiving position;
   applying flux to said third substrate;
   returning said first plate to the loading position;
   simultaneously rotating the first and second plates, such that the first plate is in the ball receiving position, and the second plate is returned to the loading position;
   mounting solder balls to the third substrate on the first plate; and
   demounting the second substrate from the second plate.

6. The method according to claim 1, wherein the step of applying flux comprises the steps of:
   sweeping a flux applicator across a surface at a pre-determined height;
   pressing a flux template to the surface, so as to pick up flux on the template;
   applying said flux template to the first substrate; and
   consequently applying flux to the first substrate in a pattern determined by the template.

7. The method according to claim 1, wherein the step of mounting solder balls on the first substrate comprises the steps of:
   sweeping solder balls across a ball template;
   positioning the solder balls into vacuum apertures of the ball template in an orientation to match that required on the substrate;
   bringing a ball suction tool into proximity with the template;
   purging the solder balls from the apertures of the template;
   engaging the solder balls in apertures of said ball suction tool, in the same orientation as that of the template;
   bringing the ball suction tool, with the solder balls, into proximity with the first substrate; and
   mounting the solder balls to the first substrate in the pre-determined orientation.

8. The method according to claim 7, further comprising the step, after engaging the solder balls with the ball suction tool and prior to bringing the ball suction tool into proximity with the first substrate, of:
   inspecting the ball suction tool to determine if any apertures are missing a corresponding solder ball.

9. The method according to claim 7, further comprising the step, after mounting the solder balls on the first substrate, of:
   inspecting the ball suction tool to determine if any apertures still have a corresponding solder ball.

* * * * *

UNITED STATES PATENT AND TRADEMARK OFFICE
CERTIFICATE OF CORRECTION

| | | |
|---|---|---|
| PATENT NO. | : 8,061,583 B2 | Page 1 of 1 |
| APPLICATION NO. | : 12/515900 | |
| DATED | : November 22, 2011 | |
| INVENTOR(S) | : Ling et al. | |

It is certified that error appears in the above-identified patent and that said Letters Patent is hereby corrected as shown below:

Column 2

Line 29, "refiner" should read --refiller--

Line 31, "refiner" should read --refiller--

Signed and Sealed this
Twenty-eighth Day of February, 2012

David J. Kappos
*Director of the United States Patent and Trademark Office*